(12) United States Patent
Isokawa et al.

(10) Patent No.: US 11,380,561 B2
(45) Date of Patent: Jul. 5, 2022

(54) CLEANING DEVICE, SUBSTRATE PROCESSING APPARATUS, MAINTENANCE METHOD OF CLEANING DEVICE, AND COMPUTER-READABLE RECORDING MEDIUM INCLUDING MAINTENANCE PROGRAM OF CLEANING DEVICE

(71) Applicant: EBARA CORPORATION, Tokyo (JP)

(72) Inventors: Hidetatsu Isokawa, Tokyo (JP); Mitsuhiko Inaba, Tokyo (JP); Haiyang Xu, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 222 days.

(21) Appl. No.: 16/612,194

(22) PCT Filed: May 2, 2018

(86) PCT No.: PCT/JP2018/017539
§ 371 (c)(1),
(2) Date: Nov. 8, 2019

(87) PCT Pub. No.: WO2018/207704
PCT Pub. Date: Nov. 15, 2018

(65) Prior Publication Data
US 2021/0175099 A1 Jun. 10, 2021

(30) Foreign Application Priority Data
May 10, 2017 (JP) .............................. JP2017-094029

(51) Int. Cl.
*B08B 1/00* (2006.01)
*B08B 1/04* (2006.01)
(Continued)

(52) U.S. Cl.
CPC ........ *H01L 21/67046* (2013.01); *B08B 1/006* (2013.01); *B08B 1/04* (2013.01); *B08B 13/00* (2013.01); *H01L 21/67219* (2013.01)

(58) Field of Classification Search
CPC ......... H01L 21/67046; H01L 21/67219; H01L 21/67051; H01L 21/67253; H01L 21/304;
(Continued)

(56) References Cited

U.S. PATENT DOCUMENTS 9,142,399 B2 * 9/2015 Ishibashi ............. H01L 21/6715
11,164,757 B2 * 11/2021 Xu .................... H01L 21/67051
(Continued)

FOREIGN PATENT DOCUMENTS

| JP | 2002-050602 A | 2/2002 |
|----|----|----|
| JP | 2007-295006 A | 11/2007 |
| JP | 2014-038983 A | 2/2014 |

*Primary Examiner* — Alexander Markoff
(74) *Attorney, Agent, or Firm* — BakerHostetler

(57) ABSTRACT

A cleaning device is described. In one embodiment, the cleaning device includes a cleaning member; a moving portion, a measurement portion, and a controller. The controller performs a reset operation in which the cleaning member is pressed against the reference member before cleaning, a cleaning member is moved in a direction away from the reference member after the measured value of the measurement portion reaches a predetermined reset load, when the measurement values of the measurement portion for each unit movement amount of the cleaning member become equal to each other at least twice consecutively, a position of the cleaning member at the time is set as a reference position of the cleaning member at the time of cleaning, and the measurement value of the measurement portion at the time is set as a pressing reference value at the time of cleaning.

8 Claims, 11 Drawing Sheets

(51) Int. Cl.
*B08B 13/00* (2006.01)
*H01L 21/67* (2006.01)

(58) Field of Classification Search
CPC ........... H01L 21/6704; H01L 21/02065; H01L 21/02074; H01L 21/30625; B08B 1/006; B08B 1/04; B08B 13/00
See application file for complete search history.

(56) References Cited

U.S. PATENT DOCUMENTS

| | | |
|---|---|---|
| 2002/0029431 A1 | 3/2002 | Oikawa et al. |
| 2015/0221531 A1 | 8/2015 | Tanaka |
| 2022/0020610 A1* | 1/2022 | Xu .......................... B08B 1/006 |

* cited by examiner

CLEANING DEVICE, SUBSTRATE PROCESSING APPARATUS, MAINTENANCE METHOD OF CLEANING DEVICE, AND COMPUTER-READABLE RECORDING MEDIUM INCLUDING MAINTENANCE PROGRAM OF CLEANING DEVICE

TECHNICAL FIELD

The present invention relates to a cleaning device, a substrate processing apparatus, a maintenance method of a cleaning device, and a computer-readable recording medium including a maintenance program of a cleaning device.

The present application claims priority to Japanese Patent Application No. 2017-094029 filed on May 10, 2017, the contents of which are incorporated herein by reference.

BACKGROUND ART

Conventionally, a substrate processing apparatus disclosed in Patent Document 1 shown below is known. The substrate processing apparatus is a chemical mechanical polishing (CMP) apparatus that polishes the surface of a substrate such as a silicon wafer in a flat manner, and includes a polishing device that polishes the substrate, a cleaning device that cleans the polished substrate, and a substrate transfer device that transfers the substrate between the polish and the cleaning device. The cleaning device includes a cleaning member that can be cleaned by contacting the substrate in order to remove particles such as a slurry (polishing liquid) residue used in CMP or polishing debris of the substrate from the substrate. As the cleaning member, for example, a roll cleaning member and a pencil cleaning member are known.

In recent years, with the miniaturization of wiring patterns and the like formed on a substrate, there has been a further demand for improvement in cleanliness of the substrate after cleaning and reduction of the influence on the substrate by the cleaning process (for example, generation of scratches). For this reason, for example, it is required to appropriately control the pressing load of the cleaning member against the substrate. Based on such a requirement, a cleaning device including a measurement portion (for example, a load cell and the like) that measures the load of the cleaning member against the substrate has been proposed. By using the measurement value of the measurement portion, attempts have been made to appropriately control the load applied to the substrate. In addition, since such a measurement portion measures the load applied to the substrate through the cleaning member or the like, even if the cleaning member is not in contact with the substrate, the weight of the cleaning member, a support member thereof, and the like is added to the measurement portion.

In addition, in the substrate manufacturing process and the like, while it is always required to reduce the time required for one process, it is also required to reduce the impact when the cleaning member comes into contact with the substrate (i.e., wafer touchdown). For this reason, attempts have been made to achieve both a reduction in the time required for the cleaning process and a reduction in impact when the cleaning member contacts the substrate by the followings. That is, during cleaning by the cleaning device, the cleaning member is moved at high speed from the origin position of the cleaning member to a position that is close to the substrate and not in contact (hereinafter referred to as the reference position), and is moved at low speed from the reference position to a position that contacts the substrate.

PRIOR ART DOCUMENTS

Patent Documents

[Patent Document 1] Japanese Unexamined Patent Application, First Publication No. 2014-38983

DISCLOSURE OF INVENTION

Problems to be Solved by the Invention

Parts are exchanged and adjusted at the time of start-up and maintenance (hereinafter, these are referred to as "maintenance" for the sake of convenience) of the substrate processing apparatus and cleaning device. Since the weight of each cleaning member varies or due to a change in the positional relationship between the measurement portion and the cleaning member, the measurement value of the measurement portion may differ before and after maintenance. In such a situation, it may be difficult to correctly display and appropriately control the load of the cleaning member with respect to the substrate.

In order to reduce the time required for the cleaning process, it is effective to set the reference position as close to the substrate as possible, to increase the distance that the cleaning member moves at a high speed, and to reduce the distance that the cleaning member moves at a low speed. However, if the attachment position of the cleaning member is changed by maintenance, after maintenance, the cleaning member and the substrate may be greatly separated even if the cleaning member is moved to the reference position before maintenance. In such a state, the slow transfer time of the cleaning member from the reference position to contact with the substrate increases, which may increase the time required for the cleaning process.

From the above situation, during maintenance, an operator adjusts and confirms the attachment position of the cleaning member so that the reference position is set to an appropriate position in the vicinity of the substrate. In addition, a reset operation is performed so that the measurement value of the measurement portion in a state where it is not in contact with the substrate is zero. However, such work is complicated and may take a long time, and variations and the like in the reference position may occur due to differences in the skill of the operator.

The present invention has been made in view of the above circumstances, and to provide a cleaning device, a substrate processing apparatus, a maintenance method of a cleaning device, and a computer-readable recording medium including a maintenance program of a cleaning device that can easily and quickly perform a reset operation so as to set the reference position of the cleaning member, which is close to the substrate and is in a non-contact position, and to make the measurement value of the measurement portion zero in a state where the cleaning member is not in contact with the substrate.

Means for Solving the Problems

A first aspect of the present invention is a cleaning member, which includes an elastically deformable cleaning member; a moving portion capable of pressing the cleaning member with respect to the surface of the reference member;

a measurement portion measuring a load with respect to the reference member of the cleaning member; and based on a measurement value of the measuring portion, a controller capable of controlling the moving portion, wherein the controller performs a reset operation in which the cleaning member is pressed against the reference member before cleaning, a cleaning member is moved in a direction away from the reference member after the measured value of the measurement portion reaches a predetermined reset load, when the measurement values of the measurement portion for each unit movement amount of the cleaning member become equal to each other at least twice consecutively, a position of the cleaning member at the time is set as a reference position of the cleaning member at the time of cleaning, and the measurement value of the measurement portion at the time is set as a pressing reference value at the time of cleaning.

A second aspect of the present invention is a maintenance method of a cleaning device, the cleaning device including: an elastically deformable cleaning member; a moving portion capable of pressing the cleaning member with respect to the surface of the reference member; a measurement portion measuring a load with respect to the reference member of the cleaning member; and a controller capable of controlling the moving portion based on a measurement value of the measuring portion, and the method including: performing a reset operation in which the cleaning member is pressed against the reference member before cleaning, moving a cleaning member in a direction away from the reference member after the measured value of the measurement portion reaches a predetermined reset load, when the measurement values of the measurement portion for each unit movement amount of the cleaning member become equal to each other at least twice consecutively, setting a position of the cleaning member at the time as a reference position of the cleaning member at the time of cleaning, and setting the measurement value of the measurement portion at the time as a pressing reference value at the time of cleaning.

A third aspect of the present invention is a computer-readable recording medium including maintenance program of a cleaning device, the cleaning device including: an elastically deformable cleaning member; a moving portion capable of pressing the cleaning member with respect to the surface of the reference member; and a measurement portion measuring a load with respect to the reference member of the cleaning member, and the medium including a maintenance program of the cleaning device that operates a computer capable of controlling the moving portion based on a measurement value of the measuring portion so as to execute a reset operation including: pressing the cleaning member against the reference member before cleaning; moving a cleaning member in a direction away from the reference member after the measured value of the measurement portion reaches a predetermined reset load; when the measurement values of the measurement portion for each unit movement amount of the cleaning member become equal to each other at least twice consecutively; setting a position of the cleaning member at the time as a reference position of the cleaning member at the time of cleaning; and setting the measurement value of the measurement portion at the time as a pressing reference value at the time of cleaning.

According to the above-described aspects, a reset operation in which the cleaning member is pressed against the reference member before cleaning, a cleaning member is moved in a direction away from the reference member after the measured value of the measurement portion reaches a predetermined reset load, when the measurement values of the measurement portion for each unit movement amount of the cleaning member become equal to each other at least twice consecutively, a position of the cleaning member at the time is set as a reference position of the cleaning member at the time of cleaning, and the measurement value of the measurement portion at the time is set as a pressing reference value at the time of cleaning.

As described above, the measurement value of the measurement portion may be different before and after maintenance on the cleaning device. For example, the measurement value of the measurement portion in a state where the cleaning member is not in contact with the substrate, that is, the value indicating the load on the substrate may be a value other than zero. Here, even if the cleaning member is moved in a state where the cleaning member is not in contact with the substrate, since the load applied to the measurement portion does not change except the influence of noise, vibration, and the like, the measurement values at the measurement portion is constant. For this reason, in the present aspect, a reset operation in which the cleaning member is pressed against the reference member, a cleaning member is moved in a direction away from the reference member after confirming that the measured value of the measurement portion reaches a predetermined reset load to bring the cleaning member reliably press the substrate, when the measurement values of the measurement portion for each unit movement amount of the cleaning member become equal to each other at least twice consecutively, a position of the cleaning member at the time is set as a reference position of the cleaning member at the time of cleaning, and the measurement value of the measurement portion at the time is set as a pressing reference value at the time of cleaning.

Therefore, in the cleaning device, the reset operation can be performed without complicated adjustment work, and the like so that the work of the operator can be simplified and the working time can be reduced. It is also possible to prevent variations or the like in the reference position caused by difference of skill of operators. Moreover, since the pressing reference value at the time of cleaning indicating that the load on the substrate is zero can be appropriately set, the difference between the target load with respect to the substrate of the cleaning member at the time of cleaning and the load actually applied to the substrate from the cleaning member can be made extremely small, and the reference member can be appropriately pressed with the target load during cleaning. Therefore, the influence on the substrate due to the cleaning can be reduced. In addition, since the reference position of the cleaning member can be set as close to the substrate as possible without contact, the distance that the cleaning member moves at a high speed can be increased, and the distance that the cleaning member can move at a low speed can be decreased.

According to a fourth aspect of the present invention, in the cleaning device according to the first aspect, the moving portion may include a motor that can be controlled by the controller, and a ball screw coupled to an output shaft of the motor.

According to the fourth aspect, since the moving portion includes the motor that can be controlled by the controller and the ball screw coupled to the output shaft of the motor, the controller can control the position, the transfer speed, and the like of the cleaning member with high accuracy. Therefore, the impact when the cleaning member comes into contact with the substrate can be reduced, and the load against the substrate of the cleaning member can be appropriately adjusted to a predetermined target load.

According to a fifth aspect of the present invention, in the cleaning device according to the first or second aspect, the controller may control the moving portion based on a difference between a measurement value of the measurement portion and a target load when the pressing reference value is zero According to the fifth aspect, the controller controls the moving portion based on the difference between the measurement value of the measurement portion and the target load when the pressing reference value is zero. Therefore, a closed loop control (CLC) system can be configured, and the load with respect to the substrate of the cleaning member can be more appropriately adjusted to a predetermined target load.

According to a sixth aspect of the present invention, in the cleaning device according to the fifth aspect, the cleaning device further includes a storage storing data, where the controller stores the reference position and the pressing reference value in the storage, and performs the pressing operation that after the reset operation, the cleaning member is moved toward the reference member from the reference position and the cleaning member is pressed to the reference member with a test load, and the controller stores in the storage at least one of the followings: the measurement value of the measurement portion when the pressing operation is completed; the movement amount of the cleaning member from the start to the completion of the pressing operation; the elapsed time from the start to the completion of the pressing operation; and the maximum value among the measurement values of the measurement portion from start to completion of the pressing operation.

According to the sixth aspect, the cleaning device further includes a storage storing data, where the controller stores the reference position and the pressing reference value in the storage, and performs the pressing operation that after the reset operation, the cleaning member is moved toward the reference member from the reference position and the cleaning member is pressed to the reference member with a test load, and the controller stores in the storage at least one of the followings: the measurement value of the measurement portion when the pressing operation is completed; the movement amount of the cleaning member from the start to the completion of the pressing operation; the elapsed time from the start to the completion of the pressing operation; and the maximum value among the measurement values of the measurement portion from start to completion of the pressing operation.

For this reason, when the operator performs the pressing operation after the reset operation, after the pressing operation is completed, in the storage of the controller, at least one of the followings is stored: the measurement value of the load cell when the pressing operation is completed; the movement amount of the cleaning member from the start to the completion of the pressing operation; the elapsed time from the start to the completion of the pressing operation; and the maximum value among the measurement values of the first load cell from the start to the completion of the pressing operation. By confirming these results, the operator can confirm whether the maintenance of the cleaning device is appropriately performed and the cleaning device can ensure the performance required for the cleaning process.

According to a seventh aspect of the present invention, in the cleaning device according to any one of the first and fourth to sixth aspects, the cleaning member may be formed of a cylindrical roll cleaning member whose outer peripheral surface can come into contact with the surface of the reference member while rotating around the central axis, and the reference member may be formed of a substrate.

According to the seventh aspect, the cleaning member is formed of a cylindrical roll cleaning member whose outer peripheral surface can come into contact with the surface of the reference member while rotating around the central axis, and the reference member is formed of a substrate. Therefore, the reset operation can be performed using a roll cleaning member and a substrate.

According to an eighth aspect of the present invention, in the cleaning device according to the sixth aspect, the roll cleaning member is provided as a first roll cleaning member and a second roll cleaning member on both sides of the substrate, respectively, and the controller may perform a first reset operation that is the reset operation related to the first roll cleaning member and a second reset operation that is the reset operation related to the second roll cleaning member at different times.

According to the eighth aspect, since the roll cleaning members are provided on both sides of the substrate, and the controller performs a reset operation regarding one roll cleaning member and a reset operation regarding the other roll cleaning member at different times, it is possible to prevent the reset operations of the both roll cleaning members from affecting each other, and to prevent an inappropriate reference position or pressing reference value from being set.

A ninth aspect of the present invention is the cleaning device according to any one of the first and fourth to sixth aspects, the cleaning member may be formed of the pencil cleaning member that is contactable with the surface of the reference member while rotating around an axis extending across the surface of the reference member, the reference member may be configured by a substrate or a pedestal portion arranged at a position different from the substrate, and the pedestal portion may have a surface disposed at a position equivalent to the surface of the substrate.

According to the ninth aspect, the cleaning member is formed of the pencil cleaning member that is contactable with the surface of the reference member while rotating around an axis extending across the surface of the reference member, the reference member is configured by a substrate or a pedestal portion arranged at a position different from the substrate, and the pedestal portion has a surface disposed at a position equivalent to the surface of the substrate. Therefore, the reset operation can be performed by using the pencil cleaning member, and the substrate or the pedestal portion.

A tenth aspect of the present invention is a substrate processing apparatus including: a substrate transfer portion that transfers a substrate; a polishing portion that polishes the substrate; and a cleaning portion that cleans the substrate, where the cleaning portion includes the cleaning device according to any one of the first and fourth to ninth aspects.

According to the tenth aspect, the same operation and effect as the cleaning device of the aspects described above can be performed.

Effects of the Invention

According to the aspect of the present invention, the reference position of the cleaning member that is close to the substrate and is in a non-contact position is set, and the measurement value of the measurement portion when the cleaning member is not in contact with the substrate is set to zero, and such a reset operation can be performed easily and in a short time.

EMBODIMENTS FOR CARRYING OUT THE INVENTION

First Embodiment

Hereinafter, a substrate processing apparatus according to the first embodiment of the present invention is described with reference to the drawings. In each drawing used for the following description, the scale may be changed appropriately in order to make each member a recognizable size.

Figure 1:
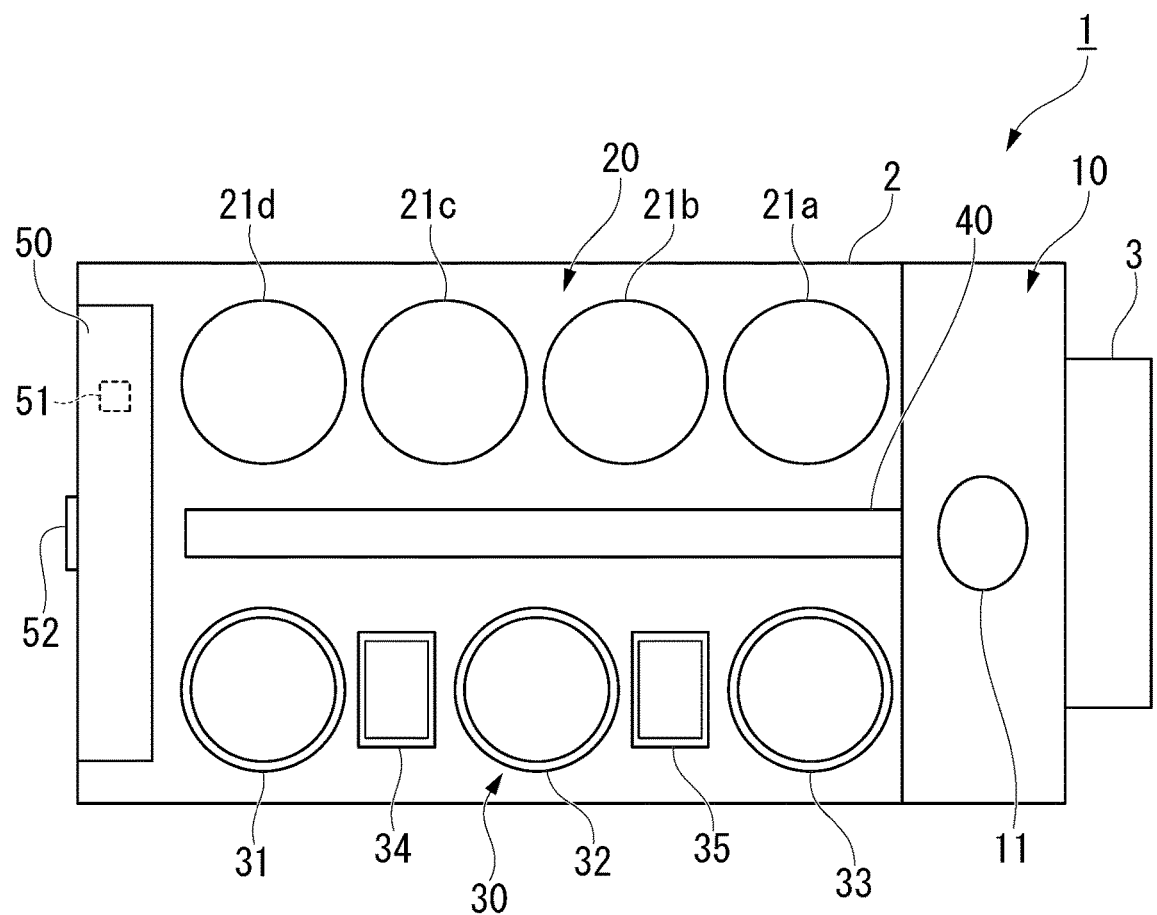
FIG. 1 is a top view showing the whole structure of the substrate processing apparatus of the first embodiment of the present invention.

A substrate processing apparatus 1 shown in FIG. 1 is a chemical mechanical polishing (CMP) apparatus that flatly polishes the surface of a disk-shaped substrate W such as a silicon wafer. The substrate processing apparatus 1 includes a rectangular parallelepiped housing 2 having a rectangular shape in plan view. A load port 3 is provided on one side surface in the longitudinal direction of the housing 2. The load port 3 can accommodate an open cassette, a Standard Manufacturing Interface (SMIF) pod, a Front Opening Unified Pod (FOUP), or the like. The SMIF and the FOUP are sealed containers that can accommodate the cassette of the substrate W therein, and can maintain an environment independent of the external space.

The substrate processing apparatus 1 includes a load and unload portion 10 that transfers a substrate W to and from the load port 3, a polisher 20 that performs polishing of the substrate W, a cleaning portion 30 that performs cleaning and drying of the substrate W, a substrate transfer portion 40 that transfers the substrate W, and a controller 50 that controls the operation of the substrate processing apparatus 1. The interior of the housing 2 is partitioned into a load and unload portion 10, a polisher 20, and a cleaning portion 30 by a partition wall having a shutter that can be opened and closed and the like.

The load and unload portion 10 is provided adjacent to the load port 3. The load and unload portion 10 is provided with a first transfer robot 11 that transfers the substrate W. The first transfer robot 11 takes out the substrate W from the cassette stored in the load port 3 and transfers it to the substrate transfer portion 40. The first transfer robot 11 also receives the substrate W from the drying device 33 described later and stores it in the cassette stored in the load port 3.

The polisher 20 is provided on one side of the housing 2 in the short direction. The polisher 20 includes a plurality of polishers 21a, 21b, 21c, and 21d (four in the present embodiment). The polishers 21a, 21b, 21c, and 21d are disposed along the longitudinal direction of the housing 2 and polish the surface while supplying a polishing liquid to the surface of the substrate W. The number of polishers installed is not limited to four, and one to three or five or more polishers may be provided in the substrate processing apparatus 1.

The cleaning portion 30 is provided on the other side of the housing 2 in the short direction. The cleaning portion 30 includes a first cleaning device (cleaning device) 31 and a second cleaning device (cleaning device) 32 that clean the substrate W polished in the polisher 20, and a drying device 33 for drying the substrate W cleaned by the first cleaning device 31 and the second cleaning device 32. The first cleaning device 31, the second cleaning device 32, and the drying device 33 are disposed along the longitudinal direction of the housing 2, and are disposed in this order toward the load and unload portion 10. The drying device 33 dries the substrate W using, for example, Iso-Propyl Alcohol (IPA) or the like.

In addition, the cleaning portion 30 further includes the second transport robot 34 disposed between the first cleaning device 31 and the second cleaning device 32, and the transfer robots 35 disposed between the second cleaning device 32 and the drying device 33. The second transfer robot 34 transfers the substrate W between the first cleaning device 31 and the second cleaning device 32, and the third transfer robot 35 transfers the substrate between the second cleaning device 32 and the drying device 33.

The substrate transport portion 40 is disposed between the polisher 20 and the cleaning portion 30 in the short direction of the housing 2 and has a transport path extending in the longitudinal direction of the housing 2. The substrate transport portion 40 may include a substrate transport robot or the like (not shown). The substrate transport portion 40 transfers the substrate W received from the load and unload portion 10 to the polisher 20, and receives the substrate W polished by the polisher 20 from the polisher 20 and transfers the substrate W to the first cleaning device 31 of the cleaning portion 30. The substrate transport portion 40 delivers the substrate W to and from each of the polishing devices 21a, 21b, 21c, and 21d of the polisher 20.

The controller 50 includes a Central Processing Unit (CPU)(not shown), a storage 51 such as a Random Access Memory (RAM) and a Read Only Memory (ROM), a display 52 which can display various control data, operation buttons, and the like of the substrate processing apparatus 1, and an input/output device or network equipment (not shown). The storage 51 stores a program for causing the substrate processing apparatus 1 to execute a predetermined operation, and can store various control data of the substrate processing apparatus 1 and the like. The CPU can sequentially execute the program while referring to the control data stored in the storage 51, thereby controlling the substrate processing apparatus 1 to execute a predetermined operation. Since the controller 50 also controls operation movement of the first cleaning device 31 and the second cleaning device 32, the controller with which the cleaning device of the present embodiment includes is included in the controller 50.

The controller 50 of the present embodiment is a control panel provided on the opposite side of the load and unload portion 10 in the longitudinal direction of the housing 2. However, for example, the controller 50 can be provided outside the housing 2, and can be a personal computer having a display, a keyboard, or the like. The storage 51 of the present embodiment is included in the controller 50; however, may be provided outside the controller 50 or outside the substrate processing apparatus 1. The program of the present embodiment is stored in the storage 51 such as a memory; however, may be stored in another computer-readable storage medium (for example, an optical disk or a magnetic disk).

Figure 2:
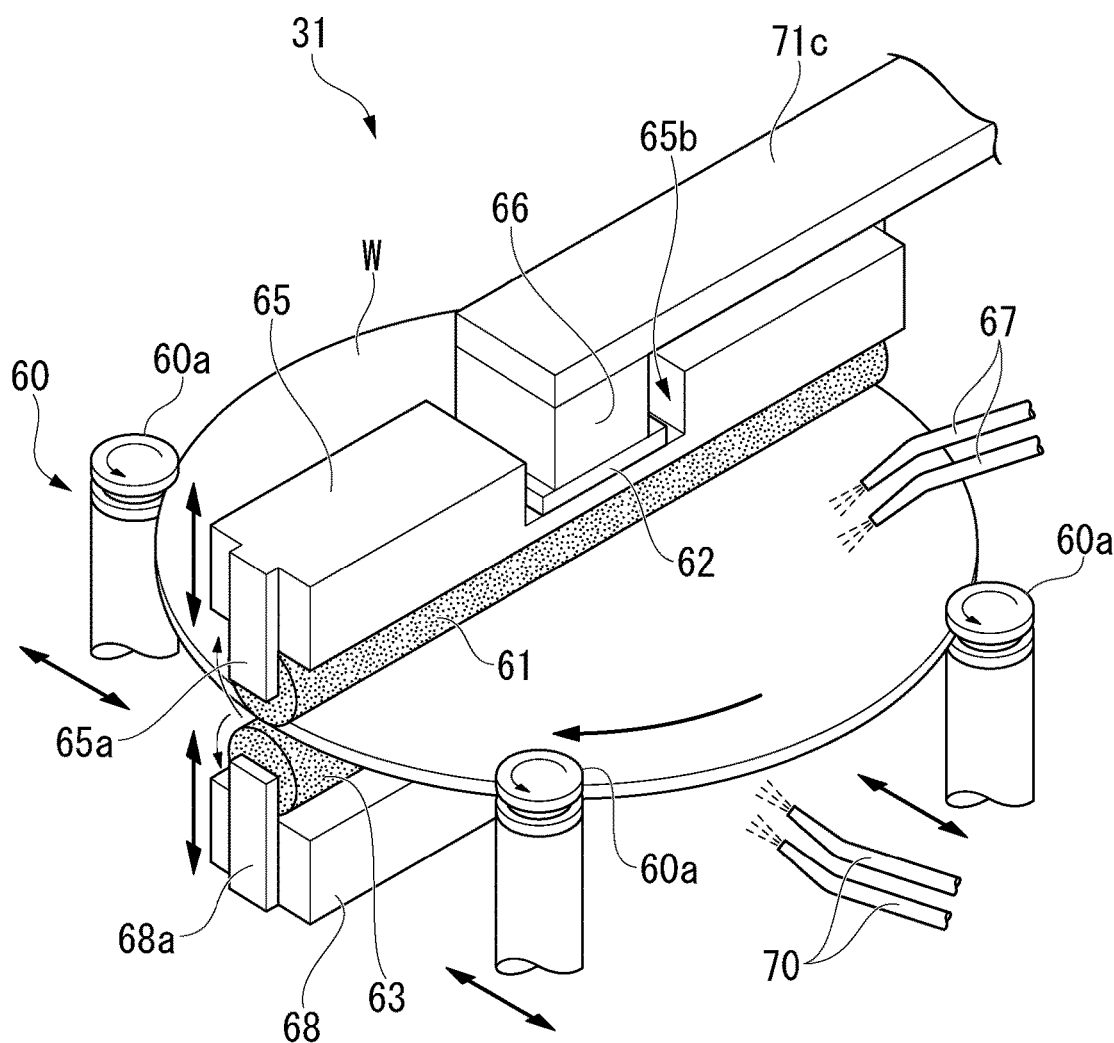
FIG. 2 is a perspective view showing a portion of the first cleaning device of the first embodiment of the present invention.
Figure 3:
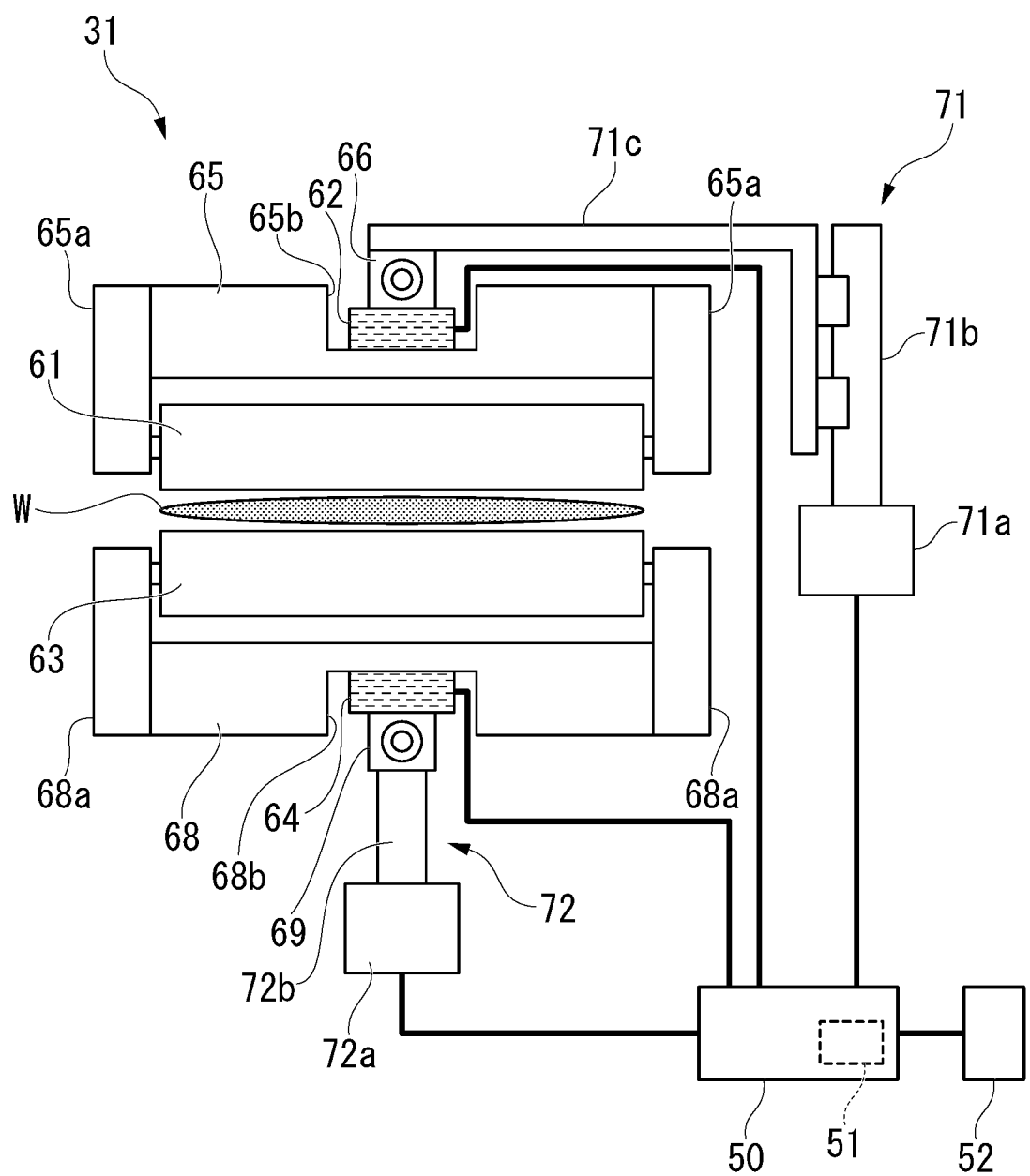
FIG. 3 is a schematic view showing the whole structure of the first cleaning device of the first embodiment of the present invention.

The first cleaning device 31 is a device that first cleans the substrate W polished in the polisher 20. As shown in FIGS. 2 and 3, the first cleaning device 31 includes a first rotation mechanism 60 that holds and rotates the substrate W, a cylindrical first roll cleaning member (roll cleaning member or cleaning member) 61 capable of scrub cleaning by contacting one of the front and back surfaces of the substrate W, a first load cell (measuring portion) 62 measuring the load with respect to the substrate W of the first roll cleaning member 61, a first moving portion (moving portion) 71 capable of pressing the first cleaning member 61 against the above-described one surface of the substrate W, a cylindrical second roll cleaning member (roll cleaning member or cleaning member) 63 capable of scrub cleaning while contacting the other surface of the front and back surfaces of the substrate W, a second load cell (measurement portion) 64 measuring the load of the second roll cleaning member 63 with respect to the substrate W, and the second moving portion (moving portion) 72 capable of pressing the second roll cleaning member 63 against the other surface of the substrate W.

The central axis (a line passing through the center of the substrate W and perpendicular to the surface thereof) of the substrate W held by the first rotation mechanism 60 of the present embodiment is parallel to the vertical direction, and the cleaning member 61 side is referred to as the upper side, and the second roll cleaning member 63 side is referred to as the lower side. The direction orthogonal to a vertical direction is referred to as a horizontal direction. In a plan view viewed from the central axis direction of the substrate W, a direction orthogonal to the central axis line is referred to as a radial direction, and a direction around the central axis line is referred to as a circumferential direction.

The first rotation mechanism 60 has a plurality of holding rollers 60a that hold the outer peripheral surface of the substrate W and rotate the substrate W around the central axis thereof. The plurality of holding rollers 60a are each formed in a cylindrical shape extending in the vertical direction and are disposed at intervals in the circumferential direction, and at least one of the plurality of holding rollers 60a is a drive portion such as a motor. The holding roller 60a that is not connected to the drive portion can freely rotate around the central axis thereof. In addition, the plurality of holding rollers 60a can be moved in the horizontal direction by a driving portion such as an air cylinder. When the substrate W is taken out, the plurality of holding rollers 60a are evacuated radially outward from the state shown in FIG. 2. When a downward load is applied from the first roll cleaning member 61 and also an upward load is applied from the second roll cleaning member 63 against the substrate W held by the plurality of holding rollers 60a, the plurality of holding rollers 60a can hold the substrate W even.

The first roll cleaning member 61 is formed of a cylindrical PVA sponge or the like that can be elastically deformed and can pass through and retain a cleaning liquid (chemical liquid), pure water (DIW: De-Ionized Water), and the like, and the outer peripheral surface of the first roll cleaning member 61 can contact the upper surface of the substrate W while rotating around the central axis thereof. That is, the central axis of the first roll cleaning member 61 extends in the horizontal direction. The total length of the first roll cleaning member 61 in the longitudinal direction is slightly larger than the diameter of the substrate W. An inner rinse supply portion (not shown) is provided inside the first roll cleaning member 61, and the cleaning liquid or the like supplied from the inner rinse supply portion into the first roll cleaning member 61 passes through the PVA sponge and is discharged to outside from the outer peripheral surface of the first roll cleaning member 61.

The first roll cleaning member 61 is supported by a first roll holder 65 so as to be rotatable around the central axis thereof. The first roll holder 65 is formed in a prismatic shape extending in the horizontal direction, and brackets 65a projecting downward are arranged at both end portions in the longitudinal direction, respectively A pair of brackets 65a rotatably supports both ends of the first roll cleaning member 61 in the longitudinal direction, and the first roll cleaning member 61 can be rotated by a driving portion such as a motor (not shown). The portion 50 controls the drive portion.

A concave portion 65b that is open upward is formed at the center of the first roll holder 65 in the longitudinal direction. A plate-like first load cell 62 is fixed to the bottom surface facing upward of the recess 65b. The upper surface of the first load cell 62 is coupled to the tip portion of the arm 71c in the first moving portion 71 described later via the first tilt mechanism 66. That is, the first roll cleaning member 61, the first roll holder 65, the first load cell 62, the first tilt mechanism 66, and the arm 71c are arranged in this order upward.

The first load cell 62 is electrically connected to the controller 50, and can output an electric signal indicating a tensile load or a compression load applied to the first load cell 62 to the controller 50. In addition, the center of the first load cell 62 is located on the central axis of the first roll cleaning member 61 in plan view.

The first load cell 62 supports the first roll holder 65 and the first roll cleaning member 61 from above. Therefore, even when the first roll cleaning member 61 is not in contact with the substrate W, the weight of the first roll holder 65 and the weight of the first roll cleaning member 61 are applied to the first load cell 62 as tensile loads. In addition, when the first roll cleaning member 61 presses the upper surface of the substrate W, the first roll cleaning member 61 receives an upward reaction force from the substrate W. Therefore, the tensile load applied to the first load cell 62 decreases, and the decreased tensile load corresponds to the load of the first roll cleaning member 61 with respect to the substrate W. Therefore, the first load cell 62 can measure the load applied to the substrate W from the first roll cleaning member 61 and can output the measurement value to the controller 50. In addition, the first load cell 62 of the present embodiment can measure a load (for example, N) applied to the substrate W to the second decimal place. The controller 50 can control the first moving portion 71 based on the measurement value of the first load cell 62.

The first tilt mechanism 66 extends in the horizontal direction and can swing the first roll holder 65 and the first roll cleaning member 61 around a rotation axis orthogonal to the longitudinal direction of the first roll cleaning member 61 in plan view. For this reason, even when the substrate W held and rotated by the first rotation mechanism 60 is warped, tilted, or the like, for example, the first roll cleaning member 61 can swing along the upper surface of the substrate W by the first tilt mechanism 66. Therefore, the first roll cleaning member 61 can uniformly apply a load to the substrate W, and can clean the upper surface of the substrate W uniformly.

A plurality of first nozzles 67 capable of supplying cleaning liquid, pure water, and the like to the upper surface of the substrate W are provided above the substrate W and at a position shifted from the first roll cleaning member 61 in plan view.

The first moving portion 71 includes a motor 71a that is electrically connected to the controller 50 and can be controlled by the controller 50, a ball screw 71b coupled to the output shaft of the motor 71a, and an arm 71c that can be moved up and down by the ball screw 71b.

The motor 71a of the present embodiment is a stepping motor, and the rotation angle and rotation speed of the output shaft thereof are controlled by a pulse signal input from the controller 50. Since the stepping motor operates in synchronization with the pulse signal, the current rotation angle of the output shaft of the motor 71a can be calculated by storing the number of pulses and the like output by the controller 50 to the motor 71a. The motor 71a is not limited to a stepping motor, and for example, a servo motor having an encoder or the like may be used as the motor 71a.

The ball screw 71b includes a screw member that extends in the vertical direction and is integrally connected to the output shaft of the motor 71a, a nut member that is screwed into the screw member and moves up and down as the screw member rotates, and a guide member guiding the nut member moving up and down. For this reason, when the output shaft of the motor 71a rotates, the nut member of the ball screw 71b can move in the vertical direction.

The arm 71c is a member that connects the ball screw 71b and the first tilt mechanism 66. The arm 71c has a vertical portion that is integrally connected to the nut member of the ball screw 71b and extends in the vertical direction, and a horizontal portion that extends in the horizontal direction from the upper end of the vertical portion. A first tilt mechanism 66 is connected to the lower surface of the end portion on the opposite side of the ball screw 71b in the horizontal portion of the arm 71c. In addition, the end portion in the horizontal portion of the arm 71c is simply referred to an end tip portion of the arm 71c.

The nut member of the ball screw 71b is connected to the first roll cleaning member 61 via the arm 71c, the first tilt mechanism 66, the first load cell 62, and the first roll holder 65. For this reason, the first roll cleaning member 61 can be moved up and down by moving the nut member of the ball screw 71b up and down as the motor 71a is driven, that is, the first roll cleaning member 61 can be moved closer to and away from the substrate W. Since the controller S can calculate the current rotation angle of the output shaft in the motor 71a, the controller 50 can calculate the current position of the vertical direction of the first roll cleaning member 61 based on a rotation angle.

The second roll cleaning member 63 has the same configuration as that of the first roll cleaning member 61, and the outer peripheral surface thereof can contact the lower surface of the substrate W while rotating around the central axis thereof. The second roll cleaning member 63 and the first roll cleaning member 61 are respectively provided on both sides in the vertical direction across the substrate W, and both the front and back surfaces of the substrate W can be subjected to scrub cleaning.

The second roll cleaning member 63 is supported by a second roll holder 68 so as to be rotatable around the central axis thereof. The second roll holder 68 is formed in a prismatic shape extending in the horizontal direction, and brackets 68a projecting upward are separately provided at both ends in the longitudinal direction. A pair of brackets 68a rotatably supports both ends of the second roll cleaning member 63 in the longitudinal direction, and the second roll cleaning member 63 can be rotated by a driving portion such as a motor (not shown) and controlled. The controller 50 controls the drive portion.

A concave portion 68b that opens downward is formed at the center of the second roll holder 68 in the longitudinal direction. That is, the second roll holder 68 has a shape equivalent to that of the first roll cleaning member 61 and is disposed in a posture opposite to that of the first roll cleaning member 61 in the vertical direction. A plate-shaped second load cell 64 is fixed to the bottom surface of the recess 68b facing downward. The lower surface of the second load cell 64 is connected to an arm or the like (not shown) in the second moving portion 72 described later via a second tilt mechanism 69. That is, the second roll cleaning member 63, the second roll holder 68, the second load cell 64, and the second tilt mechanism 69 are arranged in this order downward.

The second load cell 64 is electrically connected to the controller 50, and can output an electrical signal indicating a tensile load or a compression load applied to the second load cell 64 to the controller 50. In addition, in the plan view, the center of the second load cell 64 is located on the central axis of the second roll cleaning member 63.

The second load cell 64 supports the second roll holder 68 and the second roll cleaning member 63 from below. For this reason, even when the second roll cleaning member 63 is not in contact with the substrate W, the weight of the second roll holder 68 and the second roll cleaning member 63 is applied to the second load cell 64 as a compressive load. In addition, when the second roll cleaning member 63 presses the lower surface of the substrate W, the second roll cleaning member 63 receives a downward reaction force from the substrate W, so that the compressive load applied to the second load cell 64 further increases. The increased load corresponds to the load of the second roll cleaning member 63 with respect to the substrate W. Therefore, the second load cell 64 can measure the load applied to the substrate W from the second roll cleaning member 63 and can output the measurement value to the controller 50. In addition, the second load cell 64 of the present embodiment can measure the load (for example, N) applied to the substrate W to the second decimal place. The controller 50 can control the second moving portion 72 based on the measurement value of the second load cell 64.

The second tilt mechanism 69 can swing the second roll holder 68 and the second roll cleaning member 63 around a rotation axis that extends in the horizontal direction and is orthogonal to the longitudinal direction of the second roll cleaning member 63 in plan view. For this reason, even when the substrate W held and rotated by the first rotation mechanism 60 is warped, tilted, or the like, for example, the second roll cleaning member 63 can swing along the upper surface of the substrate W by the second tilt mechanism 69. Therefore, the second roll cleaning member 63 can uniformly apply a load to the substrate W, and can uniformly clean the lower surface of the substrate W.

A plurality of second nozzles 70 capable of supplying a cleaning liquid, pure water, and the like to the lower surface of the substrate W are provided below the substrate W and at positions shifted from the second roll cleaning member 63 in plan view.

The second moving portion 72 includes a motor 72a that is electrically connected to the controller 50 and can be controlled by the controller 50, a ball screw 72b coupled to the output shaft of the motor 72a, an arm (not shown) that can be moved up and down by the ball screw 72b, and the like.

The motor 72a of the present embodiment is a stepping motor like the motor 71a, and the controller 50 can calculate the current rotation angle of the output shaft of the motor 72a by storing the number of pulses output to the motor 72a. The motor 72a is not limited to a stepping motor, and for example, a servo motor having an encoder or the like may be used as the motor 72a.

The ball screw 72b extends in the vertical direction and is integrally connected to the output shaft of the motor 72a, a nut member that is screwed into the screw member and moves up and down as the screw member rotates, and a guide member guiding the vertical motion of the nut member. For this reason, by the rotation of the output shaft of the motor 72a, the nut member of the ball screw 72b can move in the vertical direction.

The arm of the second moving portion 72 is a member that connects the nut member of the ball screw 72b and the second tilt mechanism 69. In order to connect the nut member of the ball screw 72b and the second tilt mechanism 69, for example, a bracket or the like may be used.

The nut member of the ball screw 72b is connected to the second roll cleaning member 63 via the above-mentioned arm, the second tilt mechanism 69, the second load cell 64, and the second roll holder 68. For this reason, the second roll cleaning member 63 can be moved up and down by moving the nut member of the ball screw 72b up and down as the motor 72a is driven, that is, the second roll cleaning member 63 can be moved closer to and away from the substrate W. Since the controller 50 can calculate the current rotation angle of the output shaft in the motor 72a, the controller 50 can calculate the current position of the vertical direction of the second roll cleaning member 63 based on a rotation angle.

Figure 4:
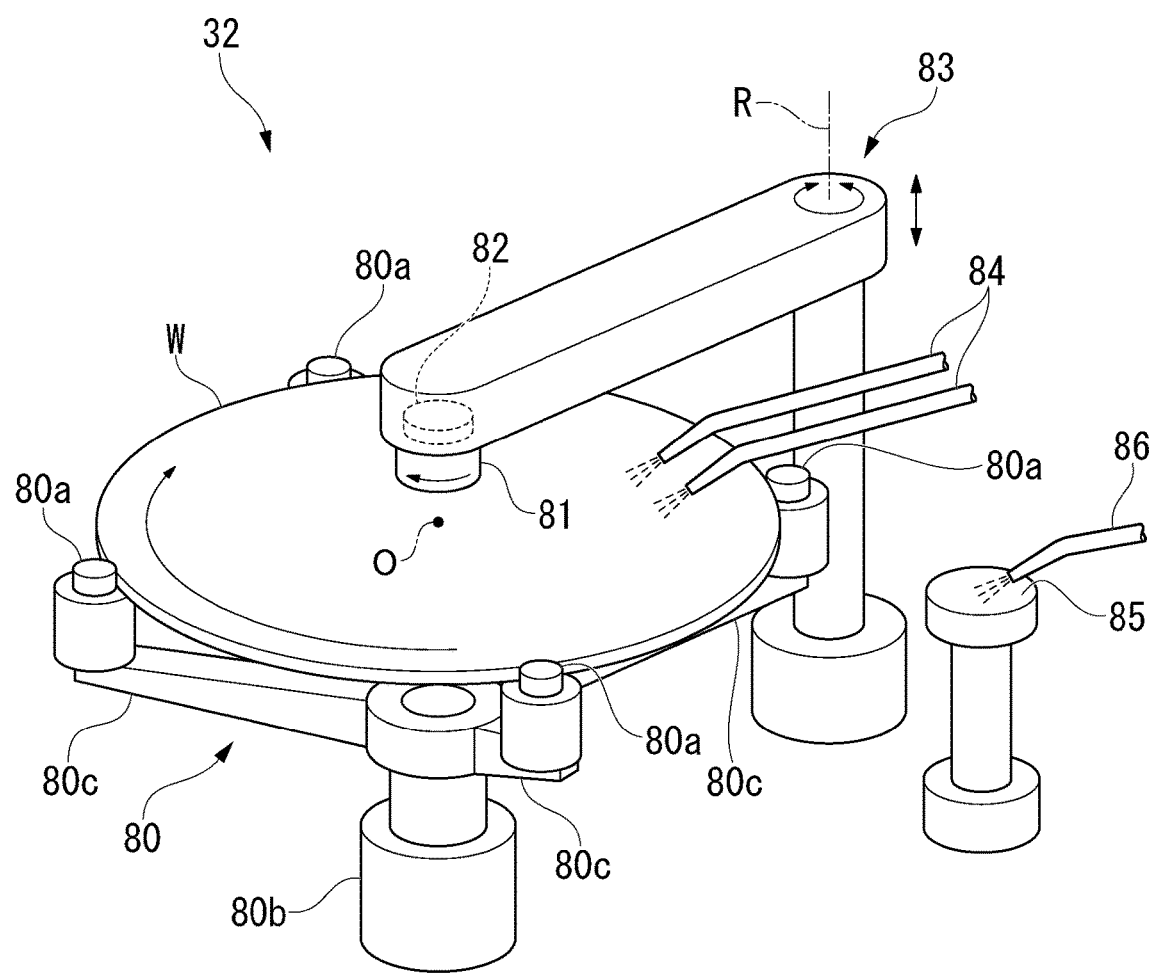
FIG. 4 is a perspective view showing the second cleaning device of the first embodiment of the present invention.
Figure 5:
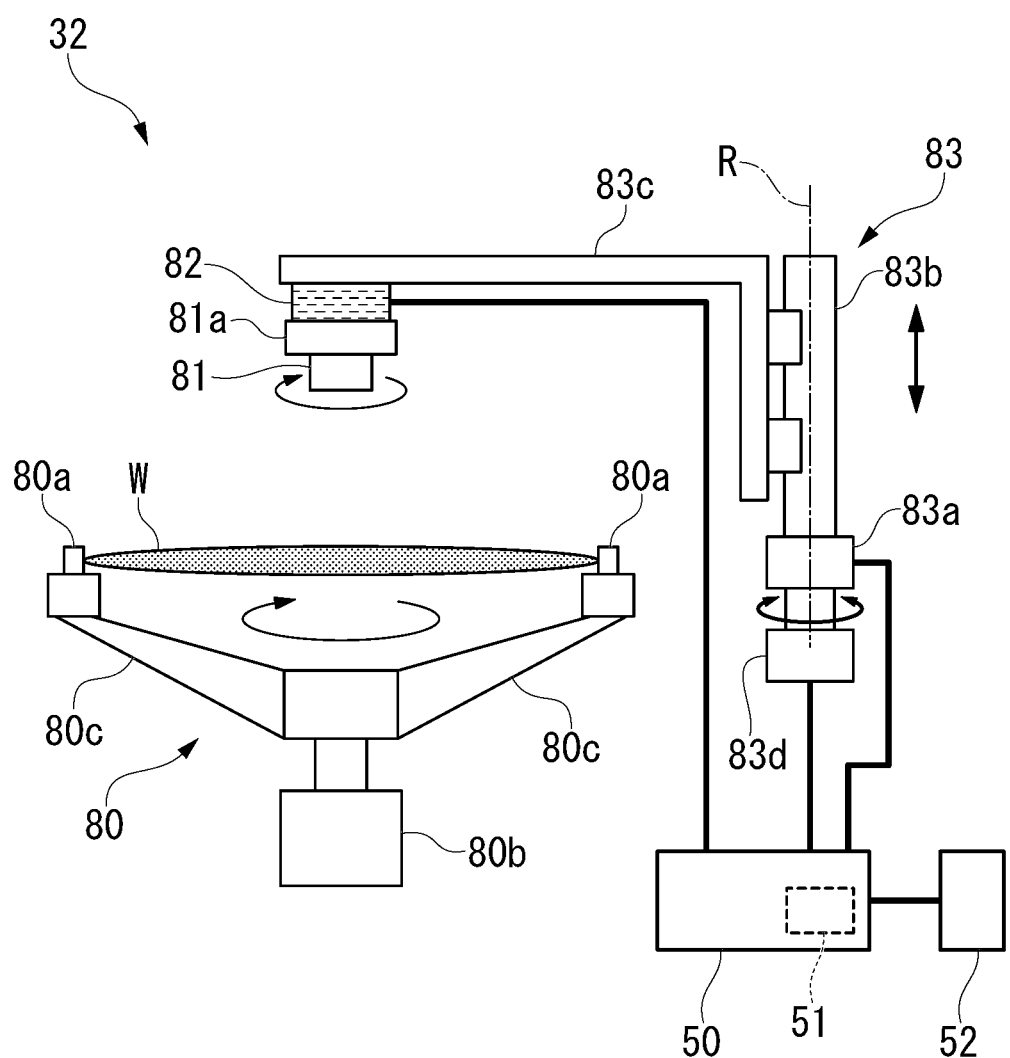
FIG. 5 is a schematic view showing the whole structure of the second cleaning device of the first embodiment of the present invention.

The second cleaning device 32 is a device that further cleans the substrate W cleaned by the first cleaning device 31. As shown in FIGS. 4 and 5, the second cleaning device 32 includes a second rotation mechanism 80 that holds and rotates the substrate W, a cylindrical pencil cleaning member (cleaning member) 81 capable of scrub cleaning by contacting the upper surface of the substrate W, a third load cell (measurement portion) 82 measuring the load of the pencil cleaning member 81 with respect to the substrate W, a third moving portion (moving portion) 83 capable of pressing the pencil cleaning member 81 against the upper surface of the substrate W. The central axis of the substrate W held by the second rotation mechanism 80 of the present embodiment is parallel to the vertical direction.

The second rotation mechanism 80 includes a motor 80b as a drive portion, and a plurality of (four in the present embodiment) arms 80c that are connected to the output shaft of the motor 80b and extend upward and radially outward. The holding portions 80a capable of holding the outer peripheral surface of the substrate W are respectively disposed at the radially outer ends of the arms 80c. The plurality of holding portions 80a are arranged at intervals in the circumferential direction. The second rotation mechanism 80 can rotate the substrate W around the central axis thereof by driving the motor 80b in a state where the substrate W is held by the plurality of holding portions 80a. The plurality of holding portions 80a can hold the substrate W even when a downward load is applied from the pencil cleaning member 81 to the substrate W held by the plurality of holding portions 80a.

The pencil cleaning member 81 is formed of a cylindrical PVA sponge or the like that can be elastically deformed and can pass and retain cleaning liquid (chemical liquid), pure water, or the like, and the central axis thereof is parallel to the vertical direction. The lower end surface of the pencil cleaning member 81 can come into contact with the upper surface of the substrate W while rotating around the central axis. The lower end surface of the pencil cleaning member 81 is parallel to the upper surface of the substrate W held by the second rotation mechanism 80.

The pencil cleaning member 81 is supported by, for example, a third roll holder 81a formed in a cylindrical shape with a top, and is provided so as to protrude downward from the third roll holder 81a. The pencil cleaning member 81 can be rotated around the central axis thereof by a driving portion such as a motor (not shown), and the controller 50 controls the driving portion.

An upper end portion of the third roll holder 81a is connected to a tip end portion of an arm 83c in a third moving portion 83 to be described later via a plate-like third load cell 82. That is, the pencil cleaning member 81, the third roll holder 81a, the third load cell 82, and the arm 83c are arranged in this order upward.

The third load cell 82 is electrically connected to the controller 50, and can output an electric signal indicating a tensile load or a compression load applied to the third load cell 82 to the controller 50. In addition, in the plan view, the center of the third load cell 82 is disposed at the same position as the central axis of the pencil cleaning member 81.

The third load cell 82 supports the third roll holder 81a and the pencil cleaning member 81 from above. Therefore, even when the pencil cleaning member 81 is not in contact with the substrate W, the weight of the third roll holder 81a and the weight of the pencil cleaning member 81 are applied to the third load cell 82 as tensile loads. In addition, when the pencil cleaning member 81 presses the upper surface of the substrate W, the pencil cleaning member 81 receives an upward reaction force from the substrate W. Therefore, the tensile load applied to the third load cell 82 decreases, and the decreased tensile load corresponds to the load of the pencil cleaning member 81 with respect to the substrate W. Therefore, the third load cell 82 can measure the load applied to the substrate W from the pencil cleaning member 81 and can output the measurement value to the controller 50. In addition, the third load cell 82 of the present embodiment can measure a load (for example, N) applied to the substrate W to the second decimal place. The controller 50 can control the third moving portion 83 based on the measurement value of the third load cell 82.

A plurality of third nozzles 84 that can supply cleaning liquid, pure water, or the like to the upper surface of the substrate W are provided above the substrate W and at a position that does not interfere with the arm 83c and the pencil cleaning member 81 when the arm 83c of the third moving portion 83 swings.

The third moving portion 83 includes a vertical motor 83a which is electrically connected to the controller 50 and can be controlled by the controller 50, a ball screw 83b coupled to the output shaft of the vertical motor 83a, an arm 83c which can move vertically by the ball screw 83b, and a swing motor 83d that is electrically connected to the controller 50 and can be controlled by the controller 50.

The vertical motor 83a of the present embodiment is a stepping motor like the motor 71a of the first cleaning device 31, and the controller 50 stores the number of pulses and the like output to the vertical motor 83a, thereby the current rotation angle of the output shaft in the motor 83a can be calculated. The vertical motor 83a is not limited to a stepping motor, and for example, a servo motor having an encoder or the like may be used as the vertical motor 83a.

The ball screw 83b includes a screw member that extends in the vertical direction and is integrally connected to the output shaft of the vertical motor 83a, a nut member that is screwed into the screw member and moves up and down as the screw member rotates, and a guide member guiding the vertical movement of the nut member. For this reason, the nut member of the ball screw 83b can move in the vertical direction by rotating the output shaft of the vertical motor 83a.

The arm 83c is a member that couples the ball screw 83b and the third load cell 82. The arm. The arm 83c has a vertical portion that is coupled to the nut member of the ball screw 83b and extends in the vertical direction, and a horizontal portion that extends in the horizontal direction from the upper end of the vertical portion. The third load cell 82 is coupled to the lower surface of the end portion opposite to the ball screw 83b in the horizontal portion of the arm 83c. Note that the end portion of the arm 83c in the horizontal portion is simply referred to as the tip portion of the arm 83c.

The nut member of the ball screw 83b is coupled to the pencil cleaning member 81 via the arm 83c, the third load cell 82, and the third roll holder 81a. For this reason, the pencil cleaning member 81 can be moved up and down by moving the nut member of the ball screw 83b up and down as the vertical motor 83a is driven. The controller 50 can calculate the current rotation angle of the output shaft of the vertical motor 83a, and therefore can calculate the current vertical position of the pencil cleaning member 81 based on the rotation angle.

The output shaft of the swing motor 83d is coupled to a coupling member or the like (not shown), and a case of the vertical motor 83a and a guide member of the ball screw 83b are integrally connected to the coupling member. For this reason, by the operation of the swing motor 83d, the vertical motor 83a and the ball screw 83b rotate around the central axis R of the output shaft of the swing motor 83d, and thus the arm 83c swings around the central axis R. Therefore, the pencil cleaning member 81 can swing around the central axis R.

The swing motor 83d of the present embodiment is a stepping motor like the vertical motor 83a, and the current rotation angle of the output shaft of the swing motor 83d can be calculated by storing the number of pulses and the like output by the controller 50 to the swing motor 83d. Therefore, the controller 50 can calculate the current position around the central axis R of the pencil cleaning member 81 based on the current rotation angle of the swing motor 83d. The swing motor 83d is not limited to a stepping motor, and for example, a servo motor having an encoder or the like may be used as the swing motor 83d.

At the time of cleaning the substrate W, the pencil cleaning member 81 comes close to the substrate W and contacts the center O on the upper surface of the substrate W by the operation of the third moving portion 83 controlled by the controller 50 and rotates. By swinging around the central axis R by driving the third moving portion 83 while being in contact with the upper surface of the substrate W, the entire upper surface of the substrate W can be cleaned by moving from the substrate W to a radially outer position.

As shown in FIG. 4, a pedestal portion 85 extending in the vertical direction is provided at a position different from the substrate W held by the second rotation mechanism 80 in plan view. The upper end portion of the pedestal portion 85 is disposed on the swing path of the pencil cleaning member 81 in a plan view, and the swinging pencil cleaning member 81 can come into contact with the upper end surface of the pedestal portion 85. The upper end portion of the pedestal portion 85 is constituted by a quartz plate whose upper end surface is perpendicular to the vertical direction, and the quartz plate is disposed at the same position in the vertical direction as the upper surface of the substrate W held by the second rotation mechanism 80. In addition, in plan view, the quartz plate of the pedestal portion 85 is formed in a circular shape, and the outer diameter thereof is larger than the outer diameter of the pencil cleaning member 81. The quartz plate of the pedestal portion 85 comes into contact with the pencil cleaning member 81 so that the particles on the substrate W attached to the pencil cleaning member 81 can be removed from the pencil cleaning member 81.

A fourth nozzle 86 capable of supplying pure water or the like to the upper end surface of the pedestal portion 85 is provided above the pedestal portion 85. By supplying pure water or the like from the fourth nozzle 86 to the upper end surface of the pedestal portion 85, particles adhering to the quartz plate can be washed away.

Next, the operation of the substrate processing apparatus 1 of the present embodiment is described. The operations of the load and unload portion 10, the polisher 20, the drying device 33 in the cleaning portion 30, and the substrate transport portion 40 are the same as those in the prior art, and thus description thereof is omitted.

A reset operation setting the respective reference positions of the roll cleaning members 61 and 63 that are close to the substrate W and are in a non-contact position in the maintenance (start-up and maintenance) of the first cleaning device 31, and setting the measurement values of the load cells 62 and 64 in a state in which the load cells 62 and 64 are not in contact with W to zero, and a pressing operation verifying whether the maintenance has been appropriately performed are described. The reset operation and the pressing operation of the first cleaning device 31 are performed by the controller 50 controlling the first cleaning device 31. In particular, the vertical movement of the roll cleaning members 61 and 63 is performed by the moving portions 71 and 72, respectively, controlled by the controller 50. Moreover, the operation movement of the first cleaning device 31 is performed such that the controller 50 performs the program sequentially stored in the storage portion 51.

Figure 6:
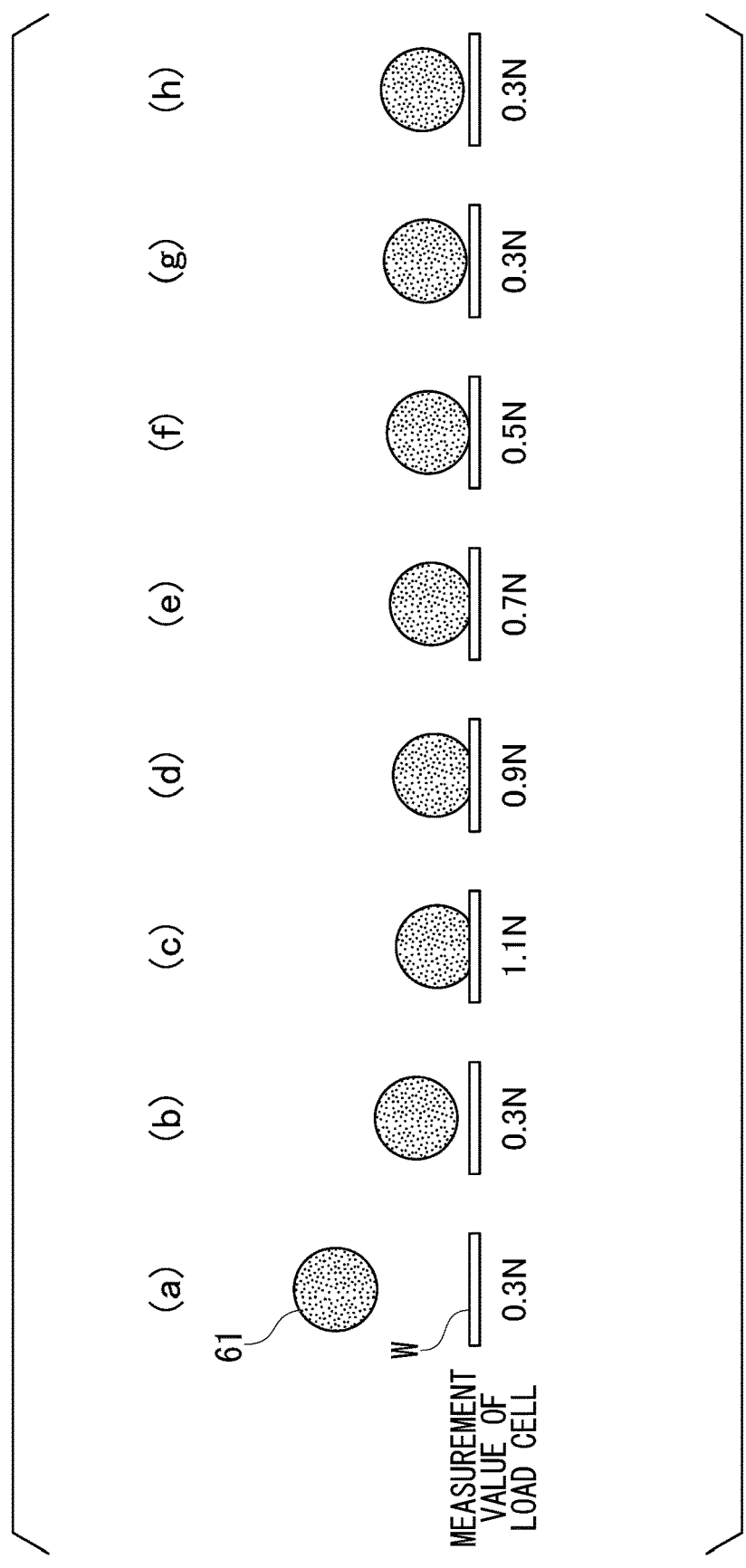
FIG. 6 is a schematic view showing a process of the reset operation of the first cleaning device of the first embodiment of the present invention.

The reset operation regarding the first roll cleaning member 61 of the first cleaning device 31 is described with reference to FIG. 6. Parts (a) to (h) of FIG. 6 show that the reset operation proceeds in this order.

In the storage 51, a reset load (for example, 1.1 N) for the first cleaning device 31 is set in advance by input via the display 52 or the like.

After the replacement of the portions (for example, the first roll cleaning member 61 and the first load cell 62) and the adjustment are performed by the maintenance of the first cleaning device 31, and before the cleaning operation with respect to the substrate W, the operator operates the "first cleaning device: reset operation start button" displayed on the display 52 of the controller 50. This operation may be performed when the first roll cleaning member 61 is already at the origin position, or by performing the operation, the controller 50 may first move the first roll cleaning member 61 to the origin position. In the present description, the first load cell 62 is replaced even when the first roll cleaning member 61 is not in contact with the substrate W by replacing the first roll cleaning member 61 and the like by maintenance of the first cleaning device 31. The measurement value is 0.3 N (parts (a) and (b) of FIG. 6), and the first load cell 62 shows a load different from the actual load on the substrate W of the first roll cleaning member 61.

In addition, the substrate W polished by the polisher 20 is transferred from the substrate transport portion 40 to the first cleaning device 31 and held by the first rotation mechanism 60. The unpolished substrate W may be transferred from the substrate transport portion 40 to the first cleaning device 31. For this reason, in the first cleaning device 31, the reference member of the present embodiment is formed of the substrate W.

Subsequently, by controlling the controller 50, the first rotation mechanism 60 rotates the substrate W, pure water or the like is supplied from the inner rinse supply portion to the inside of the first roll cleaning member 61, and the first cleaning member 61 is rotated around the central axis thereof. The rotation speed of the first roll cleaning member 61 is, for example, 200 min$^{-1}$. In the present embodiment, pure water or the like is not supplied from the first nozzle 67 during the reset operation; however, pure water or the like may be supplied from the first nozzle 67 to the upper surface of the substrate W during the reset operation. In addition, the rotation speed of the substrate W, the presence or absence of the inner rinse, the supply amount thereof, and the rotation speed of the first roll cleaning member 61 may be adjusted appropriately.

After a predetermined time (for example, 3 seconds) has elapsed since the rotation of the first roll cleaning member 61 has started, the controller 50 directs the first roll cleaning member 61 toward the upper surface of the substrate W, and from the origin position, the first roll cleaning member 61 is moved at a high speed to the reference position (reference position used before maintenance, hereinafter referred to as the previous reference position) currently stored in the storage 51 (part (a) of FIG. 6). The first roll cleaning member 61 may start moving toward the substrate W at the same time with the start of the rotation.

Subsequently, when the first roll cleaning member 61 reaches the previous reference position, the controller 50 moves the first roll cleaning member 61 toward the substrate W at a low speed (part (b) of FIG. 6). The speed ratio of the low speed movement with respect to the high speed movement of the first roll cleaning member 61 is, for example, 100/5. By the low speed movement, the controller 50 presses the first roll cleaning member 61 in contact with the upper surface of the substrate W.

Next, the controller 50 further moves the first roll cleaning member 61 to the substrate W side at a low speed, and obtains and refers to the measurement value of the first load cell 62. Since the first roll cleaning member 61 is in contact with the substrate W, the reaction force that the first roll cleaning member 61 receives from the substrate W increases with the movement of the first roll cleaning member 61, and thus the measurement value of the first load cell 62 gradually increases.

When the measurement value of the first load cell 62 reaches the reset load (1.1 N), the controller 50 stops the movement of the first roll cleaning member 61 (part (c) of FIG. 6). The first roll cleaning member 61 is moved by a unit movement amount (for example, 0.1 mm) and is stopped, and the controller 50 may confirm whether the measurement value of the first load cell 62 has reached the reset load while the movement first roll cleaning member 61 stops. These movement and the confirmation may be repeated. On the other hand, the controller 50 may confirm whether the measurement value of the first load cell 62 has reached the reset load every time the first roll cleaning member 61 moves by the unit movement amount while continuously moving the first roll cleaning member 61 at a low speed, and when the value reaches, the movement of the first roll cleaning member 61 may be stopped.

Thereafter, the controller 50 moves the first roll cleaning member 61 at a low speed in a direction away from the substrate W while referring to the measurement value of the first load cell 62. As the first roll cleaning member 61 moves away from the substrate W, the reaction force that the first roll cleaning member 61 receives from the substrate W decreases; therefore, the measurement value of the first load cell 62 gradually decreases (parts (d) to (g) of FIG. 6).

At this time, the controller 50 stores the measurement value of the first load cell 62 for each unit movement amount (for example, 0.1 mm) of the first roll cleaning member 61 in the storage 51. When the measurement values become equal to each other (parts (g) and (h) of FIG. 6) at least twice consecutively, the controller 50 performs the reset operation setting and storing in the storage 51 the position of the first roll cleaning member 61 at that time as a new reference position of the first roll cleaning member 61 at the time of cleaning, and setting the measurement value of the first load cell 62 at the above-described point is set as the pressing reference value at the time of cleaning. When the first load cell 62 outputs a measurement value corresponding to the pressing reference value (0.3 N in the illustrated example), the controller 50 assumes that the load on the substrate W is zero, and performs the load display on the display 52 and the closed loop control of the load with respect to the substrate W at the time of cleaning described later.

In the storage of the measurement value of the first load cell 62 in the storage 51, the first roll cleaning member 61 may be stopped by moving the first roll cleaning member 61 in a direction away from the substrate W by a unit movement amount (for example, 0.1 mm), and while the movement of the roll cleaning member 61 is stopped, the measurement value of the first load cell 62 may be stored in the storage 51 and compared with the previous measurement value. These movements and comparisons may be repeated. On the other hand, the storage 51 may store the measurement value of the first load cell 62 every time the first roll cleaning member 61 moves the unit movement amount while continuously moving the first roll cleaning member 61 at a low speed in the direction away from the substrate W, and the comparison with the previous measurement value may be sequentially performed.

The determination as to whether or not the measurement values of the first load cell 62 are equal to each other at least twice consecutively is, for example, based on whether or not the values of the first load cell 62 are the same as the first decimal place, or may be based on whether or not the value obtained by rounding off the value of the second decimal place of the measurement value of the first load cell 62 is the same. In addition, when a predetermined threshold value (for example, 0.1 N) is stored in the storage 51 and the difference between measurement values of the first load cell 62 measured at least twice consecutively is smaller than the threshold value, it may be determined that the measurement value of the load cell 62 is equivalent at least twice consecutively.

In the above-described example, the reset operation is performed when the measurement values of the first load cell 62 are equal to each other twice consecutively; however, when the measurement value of the first load cell 62 is equal to three times or more consecutively, the reset operation may be performed.

In the above-described example, the controller 50 moves the first roll cleaning member 61 from the origin position to the previous reference position at a high speed; however, the high speed movement is not an essential requirement for the maintenance method of the present embodiment. A method may be used in which the reset operation is performed without moving the first roll cleaning member 61 at a high speed.

For example, a method of performing the reset operation without moving the first roll cleaning member 61 at high speed is described with reference to FIG. 7.

Figure 7:
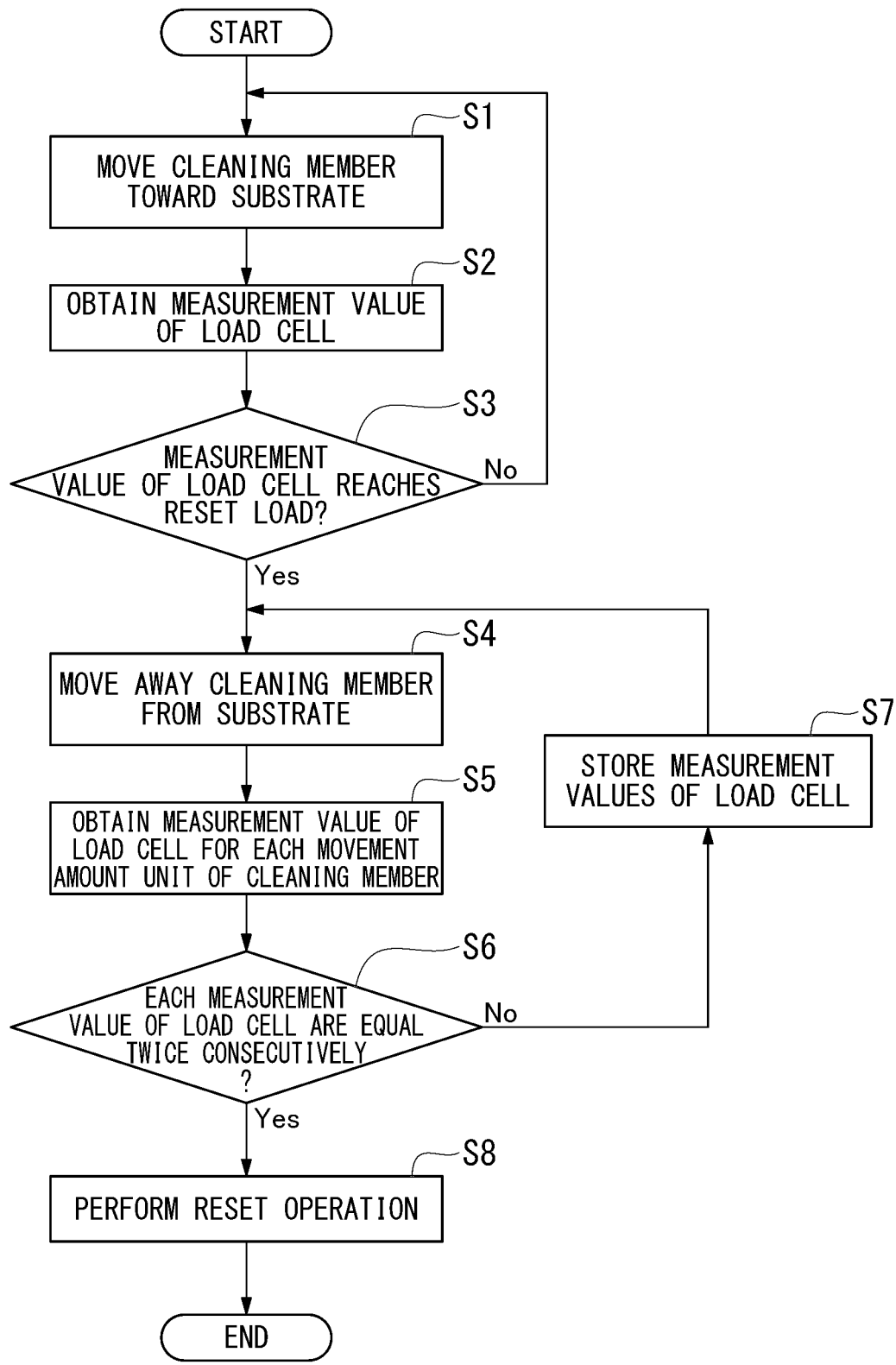
FIG. 7 is a flow chart of the reset operation movement of the first cleaning device of the first embodiment of the present invention.

First, the controller 50 presses the first roll cleaning member 61 against the upper surface of the substrate W, and from such a state, moves the first roll cleaning member 61 toward the substrate W (step S1 in FIG. 7).

Subsequently, the controller 50 obtains the measurement value of the first load cell 62 (step S2 in FIG. 7). The measurement value may be obtained for each unit movement amount of the first roll cleaning member 61.

Subsequently, the controller 50 determines whether or not the measurement value obtained in step S2 has reached a reset load (for example, 1.1 N)(step S3 in FIG. 7). If the measurement value obtained in step S2 has not reached the reset load, step S1 is performed again.

On the other hand, if the measurement value obtained in step S2 has reached the reset load, the first roll cleaning member 61 is moved away from the substrate W (step S4 in FIG. 7).

Subsequently, the controller 50 obtains the measurement value of the first load cell 62 for each unit movement amount of the first roll cleaning member 61 (step S5 in FIG. 7) Subsequently, the controller 50 determines whether or not the measurement values obtained in step S5 are equal to each other at least twice consecutively (step S6 in FIG. 7). When the measurement values obtained in step S5 are not equal to each other at least twice consecutively, the obtained measurement values are stored in the storage 51 (step S7 in FIG. 7), and step S4 is performed again.

On the other hand, when the measurement values obtained in step S5 are equal to each other at least twice consecutively, a reset operation is performed (step S8 in FIG. 7).

From the above, the reset operation related to the first roll cleaning member 61 of the first cleaning device 31 is completed.

By performing such a reset operation, even if the previous reference position of the first roll cleaning member 61 is inappropriately spaced from the upper surface of the substrate W after maintenance, the reference position of the first roll cleaning member 61 can be set appropriately.

In addition, by performing the above-described reset operation, even if the measurement value of the first load cell 62 is different before and after the maintenance, by setting the pressing reference value, the load with respect to the substrate W of the first roll cleaning member 61 displayed on the portion 52 in the state shown in part (h) of FIG. 6 can be displayed as zero. Therefore, an accurate load applied to the substrate W can be shown to the operator through the display 52 and the like.

Next, a pressing operation verifying whether the maintenance related to the first roll cleaning member 61 of the first cleaning device 31 has been appropriately performed is described.

In the storage 51, a plurality of test loads (for example, 0.8 N, 1.2 N, and 1.6 N) for the first cleaning device 31 are set in advance by input via the display 52 or the like. The number of test loads is not limited to three, but may be one or two, or four or more.

After the reset operation for the first roll cleaning member 61 and before the cleaning operation for the substrate W, the operator operates the "first cleaning device: pressing operation start button" displayed on the display 52 of the controller 50. The operation may be performed when the first roll cleaning member 61 is already at the origin position, or by performing the operation, the controller 50 may first move the first roll cleaning member 61 to the origin position. The first rotation mechanism 60 is in a state where the substrate W used in the reset operation is held.

Subsequently, by the control of the controller 50, the rotation speed of the substrate W, the presence or absence of the inner rinse to the first roll cleaning member 61, the rotation speed of the first roll cleaning member 61, and the presence or absence of supply of pure water or the like from the first nozzle 67, and the like are appropriately adjusted. These conditions may be the same as or different from those at the time of cleaning the substrate W.

Subsequently, the controller 50 moves the first roll cleaning member 61 toward the upper surface of the substrate W from the origin position to the reference position after the reset operation currently stored in the storage 51 at a high speed.

When the first roll cleaning member 61 reaches the reference position, the controller 50 performs the closed loop control until the load of the first roll cleaning member 61 with respect to the substrate W, that is, the measurement value of the first load cell 62 matches the first test load (0.8 N). In the closed loop control, the controller 50 controls the first moving portion 71 based on the difference between the measurement value of the first load cell 62 and the first test load when the pressing reference value set in the reset operation is zero. Then, the measurement value of the first load cell 62 is matched with the first test load.

Subsequently, when the measurement value of the first load cell 62 coincides with the first test load, the pressing operation for the first test load is completed. When the pressing operation is completed, at least one of the followings is stored in the storage 51: the measurement value of the first load cell 62; the amount of movement of the first roll cleaning member 61 from the start to the completion of the pressing operation (specifically, the amount of movement from the origin position to the reference position, and the amount of movement from the reference position to the position when the pressing operation is completed, and the like); the elapsed time from the start to the completion of the pressing operation (specifically, the elapsed time from the origin position to the reference position, the elapsed time from the reference position to the position when the pressing operation is completed, and the like); and a maximum value among the measurement values of the first load cell 62 from the start to the completion of the pressing operation.

Subsequently, the controller 50 similarly performs the pressing operation regarding the second test load (1.2 N) and the third test load (1.6 N).

The results are stored in the storage 51, and the operator can check these results through the display 52 and the like. Thereby, it can be confirmed whether the maintenance regarding the first roll cleaning member 61 of the first cleaning device 31 is completed appropriately. Moreover, when the above-described result differs from the expected result, it can also be estimated which portion of the first cleaning devices 31 needs to be readjusted and the like. When the measurement value of the first load cell 62 when the pressing operation is completed is different from the test load, for example, the first load cell 62, the first moving portion 71, the controller 50, or the like may need to be readjusted. When the movement amount of the cleaning member from the start to the completion of the pressing operation or the elapsed time from the start to the completion of the pressing operation is different from an expected value, for example, the reference position of the first roll cleaning member 61 may not be set appropriately, that is, the reference position is set at a position away from the substrate, or the first moving portion 71, the controller 50, or the like may need to be readjusted. When the maximum value among the measurement values of the first load cell 62 from the start to the completion of the pressing operation is larger than the expected value, for example, it is conceivable that the moving speed (moving speed at the time of closed loop control) of the first roll cleaning member 61 by the first moving portion 71 may be too high, or the first moving portion 71, the controller 50 or the like needs to be readjusted.

Thus, the pressing operation of the first roll cleaning member 61 in the first cleaning device 31 is completed.

The reset operation and the pressing operation regarding the second roll cleaning member 63 of the first cleaning device 31 are the same as the reset operation and the pressing operation regarding the first roll cleaning member 61 of the first cleaning device 31 except that the relationship with the substrate W is opposite to that of the first roll cleaning member 61 in the vertical direction; therefore, the description thereof is omitted. In addition, the reset operation regarding the roll cleaning members 61 and 63 of the first cleaning device 31 is performed at different times. In addition, in the pressing operation of the roll cleaning members 61 and 63 of the first cleaning device 31, when two or more test loads are set, respectively, one pressing operation of the roll cleaning members 61 and 63 may be first performed, or the pressing operation of the roll cleaning members 61 and 63 may be performed alternately.

Next, the cleaning operation for the substrate W using the roll cleaning members 61 and 63 of the first cleaning device 31 is described. The cleaning operation for the substrate W by the first cleaning device 31 is performed by the controller 50 controlling the first cleaning device 31. In addition, the cleaning operation of the first cleaning device 31 is performed by the controller 50 sequentially executing the program stored in the storage 51.

The substrate W polished by the polisher 20 is transferred to the first cleaning device 31 via the substrate transport portion 40 and held by the first rotation mechanism 60. At this time, the roll cleaning members 61 and 63 are at the respective origin positions.

Subsequently, under the control of the controller 50, the inner rinse is supplied to the inside of each of the roll cleaning members 61 and 63, and pure water or the like is supplied from the nozzles 67 and 70 to the upper and lower surfaces of the substrate W, respectively. The rotation speed of the substrate W by driving the mechanism 60 is adjusted to a predetermined value, and the rotation speeds of the roll cleaning members 61 and 63 are adjusted to a predetermined value. The roll cleaning members 61 and 63 rotate in opposite directions.

In addition, the controller 50 moves the roll cleaning members 61 and 63 from each origin position to each reference position at high speed.

Subsequently, when the roll cleaning members 61 and 63 reach the respective reference positions, the controller 50 performs a closed loop control until the load with respect to the substrate W of the first roll cleaning member 61, that is, the measurement value of the first load cell 62 matches the first target load (target load), and also performs a closed loop control until the load with respect to the substrate W of the second roll cleaning member 63, that is, the measurement value of the second load cell 64 matches the second target load (target load). In these closed loop controls, the controller 50 controls the first moving portion 71 based on difference between the measurement value of the first load cell 62 when the pressing reference value set in the reset operation for the first roll cleaning member 61 and the first target load is zero, and controls the second moving portion 72 based on the difference between the measurement value of the second load cell 64 when the pressing reference value set in the reset operation for the second roll cleaning member 63 and the second target load is zero. Since the measurement values of the load cells 62 and 64 when the pressing reference value set in the reset operation is set to zero are used in the closed loop control, the load applied to the substrate W can be appropriately matched with the target load. It is also possible to set different values for the first and second target loads.

During the closed loop control, the controller 50 moves the roll cleaning members 61 and 63 at a low speed. The speed ratio of the low speed movement with respect to the high speed movement of the roll cleaning members 61 and 63 is, for example, 100/5.

By performing the reset operation, the reference positions of the roll cleaning members 61 and 63 are appropriately set to positions that are close to and in non-contact to the substrate W. Therefore, the distance that the roll cleaning members 61 and 63 move at high speed can be increased and the distance that the roll cleaning members 61 and 63 move at a low speed can be decreased, so that the time required for the cleaning process by the first cleaning device 31 can be reduced.

In addition, since each reference position of the roll cleaning members 61 and 63 is set to a position that does not contact the substrate W, the roll cleaning members 61 and 63 when contacting the substrate W moves at a low speed. Therefore, the impact when the roll cleaning members 61 and 63 come into contact with the substrate W can be kept low.

By performing the closed loop control described above, the roll cleaning members 61 and 63 are pressed against the upper and lower surfaces of the substrate W by the first and second target loads, respectively. In this state, scrub cleaning for the substrate W is performed for a predetermined time.

When the cleaning is completed, the roll cleaning members 61 and 63 are separated from the substrate W, and the substrate W is taken out from the first rotation mechanism 60 and transferred to the second cleaning device 32 by the second transport robot 34.

Thereby, the cleaning process for the substrate W in the first cleaning device 31 is completed.

A reset operation setting the respective reference positions of the pencil leaning member 32 that are close to the substrate W and are in a non-contact position in the maintenance (start-up and maintenance) of the second cleaning device 32, and setting the measurement values of the third load cell 82 in a state in which the pencil cleaning member 81 is not in contact with W to zero, and a pressing operation verifying whether the maintenance has been appropriately performed are described. The reset operation and the pressing operation of the second cleaning device 32 are performed by the controller 50 controlling the second cleaning device 32. In particular, the vertical movement of the pencil cleaning member 81 is performed by the third moving portion 83, controlled by the controller 50. Moreover, the operation of the second cleaning device 32 is performed such that the controller 50 performs the program sequentially stored in the storage portion 51.

Figure 8:
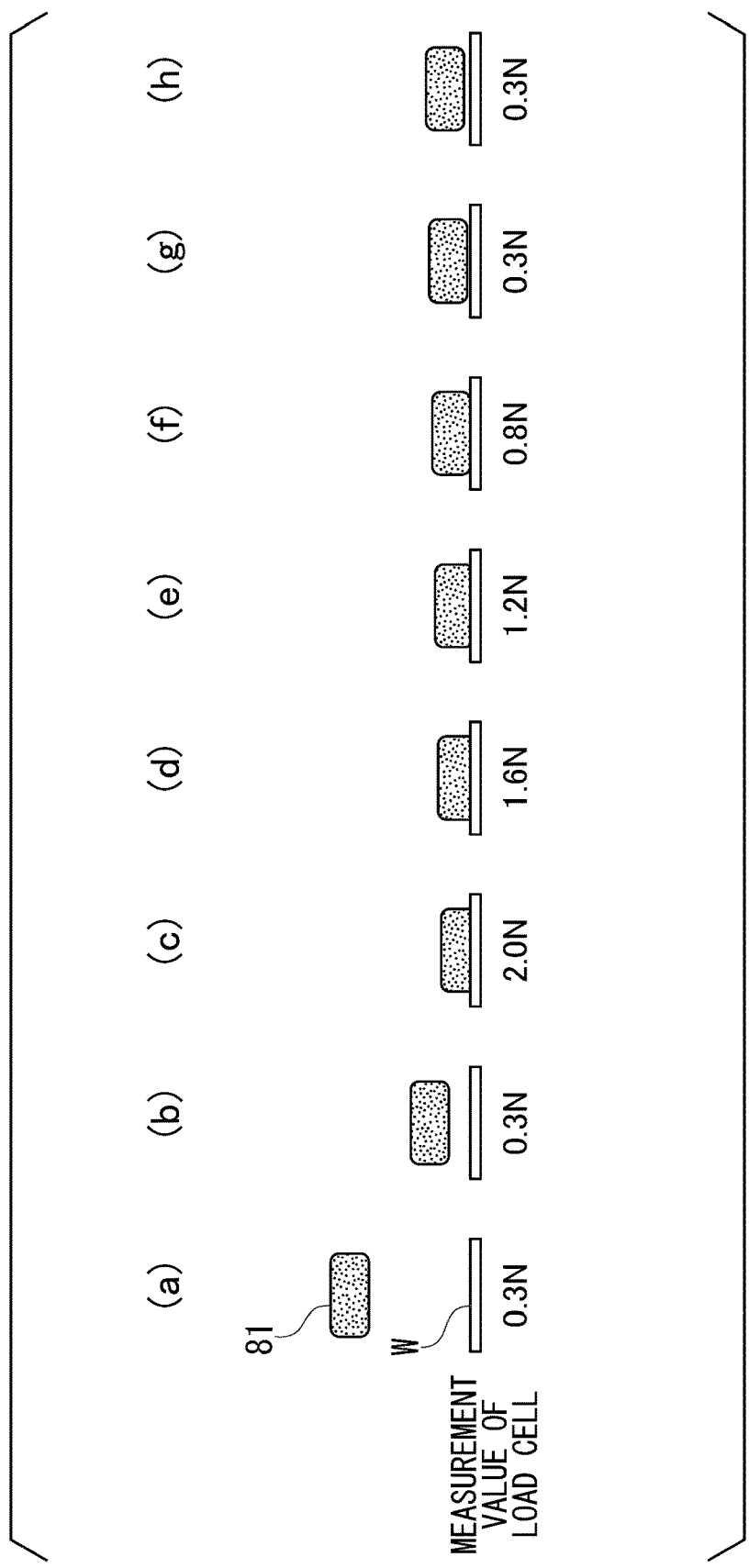
FIG. 8 is a schematic view showing the process of the reset operation of the second cleaning device of the first embodiment of the present invention.

A reset operation related to the second cleaning device 32 is described with reference to FIGS. 8A to 8H. Parts (a) to (h) of FIG. 8 show that the reset operation proceeds in this order.

In the storage 51, a reset load (for example, 2.0 N) for the second cleaning device 32 is set in advance by input via the display 52 or the like.

After the replacement of the portions (for example, the pencil cleaning member 81 and the third load cell 82) and the adjustment are performed by the maintenance of the second cleaning device 32, and before the cleaning operation with respect to the substrate W, the operator operates the "second cleaning device: reset operation start button" displayed on the display 52 of the controller 50. This operation may be performed when the pencil cleaning member 81 is already at the origin position, or by performing the operation, the controller 50 may first move the pencil cleaning member 81 to the origin position. In the present description, the third load cell 82 is replaced even when the pencil cleaning member 81 is not in contact with the substrate W by replacing the pencil cleaning member 81 and the like by maintenance of the second cleaning device 32. The measurement value is 0.3 N (parts (a) and (b) of FIG. 8), and the third load cell 82 shows a load different from the actual load on the substrate W of the pencil cleaning member 81.

In addition, the substrate W cleaned by the first cleaning device 31 is transferred to the second cleaning device 32 via the second transfer robot 34 and held by the second rotation mechanism 80. The unpolished substrate W may be transferred from the second transfer robot 34 or the like to the second cleaning device 32.

Subsequently, under the control of the controller 50, the second rotation mechanism 80 rotates the substrate W, the pencil cleaning member 81 is rotated around the central axis thereof, and pure water or the like is supplied from the third nozzle 84 to the upper surface of the substrate W. The rotation speed of the substrate W is, for example, 500 min$^{-1}$, the rotation speed of the pencil cleaning member 81 is, for example, 50 min$^{-1}$, and the supply amount of pure water or the like from the third nozzle 84 to the substrate W is, for example, 1000 L/min. The rotation speed of the substrate W, the rotation speed of the pencil cleaning member 81, and the supply amount of pure water or the like from the third nozzle 84 may be adjusted appropriately.

Subsequently, after a predetermined time (for example, 3 seconds and the like) has elapsed since the rotation of the pencil cleaning member 81 has started, the controller 50 directs the pencil cleaning member 81 toward the upper surface of the substrate W, and from the origin position, moves the pencil cleaning member 81 at a high speed to a reference position currently stored in the storage 51 (reference position used before maintenance, hereinafter referred to as the previous reference position)(part (a) of FIG. 8). The pencil cleaning member 81 may start moving toward the substrate W simultaneously with the start of the rotation.

Subsequently, when the pencil cleaning member 81 reaches the previous reference position, the controller 50 moves the pencil cleaning member 81 toward the substrate W at a low speed (part (b) of FIG. 8). The speed ratio of the low speed movement to the high speed movement of the pencil cleaning member 81 is, for example, 100/5. By the low speed movement, the controller 50 makes the pencil cleaning member 81 come into contact with the upper surface of the substrate W and presses the pencil cleaning member 81.

Subsequently, the controller 50 further moves the pencil cleaning member 81 toward the substrate W at a low speed, and obtains and refers to the measurement value of the third load cell 82. Since the pencil cleaning member 81 is in contact with the substrate W, the reaction force that the pencil cleaning member 81 receives from the substrate W increases with the movement of the pencil cleaning member 81, and thus the measurement value of the third load cell 82 gradually increases.

When the measurement value of the third load cell 82 reaches the reset load (2.0 N), the controller 50 stops the movement of the pencil cleaning member 81 (part (c) of FIG. 8). The pencil cleaning member 81 is moved and stopped by a unit movement amount (for example, 0.1 mm), and whether the measurement value of the third load cell 82 has reached the reset load is controlled while the movement of the pencil cleaning member 81 is stopped. The portion 50 may confirm and repeat the movement and confirmation. On the other hand, the controller 50 determines whether the measurement value of the third load cell 82 has reached the reset load every time the pencil cleaning member 81 moves the unit movement amount while continuously moving the pencil cleaning member 81 at a low speed. The movement of the pencil cleaning member 81 may be stopped when it is confirmed and reached.

Thereafter, the controller 50 moves the pencil cleaning member 81 at a low speed in a direction away from the substrate W while referring to the measurement value of the third load cell 82. As the pencil cleaning member 81 moves away from the substrate W, the reaction force received by the pencil cleaning member 81 from the substrate W decreases, so that the measurement value of the third load cell 82 gradually decreases (parts (d) and (g) of FIG. 8).

At this time, the controller 50 stores the measurement value of the third load cell 82 for each unit movement amount (for example, 0.1 mm) of the pencil cleaning member 81 in the storage 51. When the measurement values become equal to each other (parts (g) and (h) of FIG. 8) at least twice consecutively, the controller 50 performs the reset operation setting and storing in the storage 51 the position of the pencil cleaning member 81 at that time as a new reference position of the pencil cleaning member 81 at the time of cleaning, and setting the measurement value of the third load cell 82 at the above-described point is set as the pressing reference value at the time of cleaning. When the third load cell 82 outputs a measurement value corresponding to the pressing reference value (0.3 N in the illustrated example), the controller 50 assumes that the load on the substrate W is zero, and performs the load display on the display 52 and the closed loop control of the load with respect to the substrate W at the time of cleaning described later.

In the storage of the measurement value of the third load cell 82 in the storage 51, the pencil cleaning member 81 may be stopped by moving the pencil cleaning member 81 in a direction away from the substrate W by a unit movement amount (for example, 0.1 mm), and while the movement of the pencil cleaning member 81 is stopped, the measurement value of the third load cell 82 may be stored in the storage 51 and compared with the previous measurement value. These movements and comparisons may be repeated. On the other hand, the storage 51 may store the measurement value of the third load cell 82 every time the pencil cleaning member 81 moves the unit movement amount while continuously moving the pencil cleaning member 81 at a low speed in the direction away from the substrate W, and the comparison with the previous measurement value may be sequentially performed.

The determination as to whether or not the measurement values of the third load cell 82 are equal to each other at least twice consecutively is, for example, based on whether or not the values of the third load cell 82 are the same as the first decimal place, or may be based on whether or not the value obtained by rounding off the value of the second decimal place of the measurement value of the third load cell 82 is the same. In addition, when a predetermined threshold value (for example, 0.1 N) is stored in the storage 51 and the difference between measurement values of the third load cell 82 measured at least twice consecutively is smaller than the threshold value, it may be determined that the measurement value of the third load cell 82 is equivalent at least twice consecutively.

In the above-described example, the reset operation is performed when the measurement values of the third load cell 82 are equal to each other twice consecutively; however, when the measurement value of the third load cell 82 is equal to three times or more consecutively, the reset operation may be performed.

In the above-described example, the controller 50 moves the pencil cleaning member 81 from the origin position to the previous reference position at a high speed. However, the high speed movement is not an essential requirement for the maintenance method of the present embodiment. A method may be used in which the reset operation is performed without moving the member 81 at a high speed.

Note that a method of performing the reset operation without moving the pencil cleaning member 81 at high speed is shown in the flow chart shown in FIG. 7 used in the description of the first cleaning device 31, and therefore, the description thereof is omitted. The reset load for the pencil cleaning member 81 may be changed appropriately.

In the above example, the reset operation is performed by pressing the pencil cleaning member 81 against the upper surface of the substrate W. However, the reset operation of the second cleaning device 32 may be performed by pressing the pencil cleaning member 81 against the upper end surface of the pedestal portion 85. As described above, since the upper end portion (quartz plate) of the pedestal portion 85 has an upper end surface disposed at the same position in the vertical direction as the upper surface of the substrate W held by the second rotation mechanism 80, it is also possible to perform a reset operation of the second cleaning device 32 using the upper end surface. For this reason, in the second cleaning device 32, the reference member of the present embodiment is formed by the substrate W or the pedestal portion 85. In the reset operation when the pedestal portion 85 is used, the rotational speed of the pencil cleaning member 81 and the supply amount of pure water from the fourth nozzle 86 may be adjusted appropriately.

As described above, the reset operation regarding the second cleaning device 32 is completed.

By performing such a reset operation, even if the previous reference position of the pencil cleaning member 81 is inappropriately spaced from the upper surface of the substrate W after maintenance, the reference position of the pencil cleaning member 81 can be appropriately set.

In addition, by performing the above-described reset operation, even if the measurement value of the third load cell 82 is different before and after the maintenance, by setting the pressing reference value, the load of the pencil cleaning member 81 with respect to the substrate W displayed on the display 52 in a state shown in part (h) of FIG. 8 can be displayed as zero. Therefore, an accurate load applied to the substrate W can be shown to the operator through the display 52 and the like.

Next, a pressing operation for verifying whether the second cleaning device 32 has been appropriately maintained is described. Note that the description is omitted regarding the content similar to the pressing operation of the first cleaning device 31 described above.

A plurality of test loads (for example, 0.8 N, 1.4 N, and 2.0 N) for the second cleaning device 32 are set in advance in the storage 51 by input via the display 52 or the like. The number of test loads is not limited to three, but may be one or two, or four or more.

After the reset operation for the pencil cleaning member 81 and before the cleaning operation for the substrate W, the operator operates the "second cleaning device: pressing operation start button" displayed on the display 52 of the controller 50. The second rotation mechanism 80 is in a state where the substrate W is held.

Subsequently, by the control of the controller 50, the rotation speed of the substrate W, the rotation speed of the pencil cleaning member 81, the presence or absence of supply of pure water or the like from the third nozzle 84, and the like are appropriately adjusted. These conditions may be the same as or different from those at the time of cleaning the substrate W.

Next, the controller 50 moves the pencil cleaning member 81 toward the upper surface of the substrate W, and moves the pencil cleaning member 81 from the origin position to the reference position after the reset operation currently stored in the storage 51 at high speed.

Subsequently, When the pencil cleaning member 81 reaches the reference position, the controller 50 performs the closed loop control until the load of the pencil cleaning member 81 with respect to the substrate W, that is, the measurement value of the third load cell 82 reaches the first test load (0.8 N). In the closed loop control, the controller 50 controls the first moving portion 71 based on the difference between the measurement value of the third load cell 82 and the first test load when the pressing reference value set in the reset operation is zero. Then, the measurement value of the third load cell 82 is matched with the first test load.

Subsequently, when the measurement value of the third load cell 82 coincides with the first test load, the pressing operation for the first test load is completed. When the pressing operation is completed, at least one of the followings is stored in the storage 51: the measurement value of the third load cell 82, the amount of movement of the pencil cleaning member 81 from the start to the completion of the pressing operation (specifically, the amount of movement from the origin position to the reference position, and the amount of movement from the reference position to the position when the pressing operation is completed, and the like) the elapsed time from the start to the completion of the pressing operation (specifically, the elapsed time from the origin position to the reference position, the elapsed time from the reference position to the position when the pressing operation is completed, and the like); and a maximum value among the measurement values of the third load cell 82 from the start to the completion of the pressing operation.

Subsequently, the controller 50 similarly performs the pressing operation for the second test load (1.4 N) and the third test load (2.0 N).

The results are stored in the storage 51, and the operator can check these results through the display 52 and the like. Thereby, it can be confirmed whether the maintenance regarding the pencil cleaning member 81 of the second cleaning device 32 is appropriately completed.

Thus, the pressing operation of the pencil cleaning member 81 in the second cleaning device 32 is completed.

Next, a cleaning operation for the substrate W using the pencil cleaning member 81 of the second cleaning device 32 is described.

The substrate W cleaned by the first cleaning device 31 is transferred to the second cleaning device 32 via the second transport robot 34 and is held by the second rotation mechanism 80. At this time, the pencil cleaning member 81 is at the origin position.

Subsequently, under the control of the controller 50, pure water or the like is supplied from the third nozzle 84 to the upper surface of the substrate W the rotation speed of the substrate W is adjusted by driving the second rotation mechanism 80, and the rotation speed of the pencil cleaning member 81 is adjusted to a predetermined value.

In addition, the controller 50 moves the pencil cleaning member 81 from the origin position to the reference position at high speed.

Subsequently, when the pencil cleaning member 81 reaches the reference position, the controller 50 performs closed loop control until the load of the pencil cleaning member 81 on the substrate W, that is, the measurement value of the third load cell 82 matches the target load. In the closed loop control, the controller 50 controls the third moving portion 83 based on the difference between the measurement value of the third load cell 82 and the above-described target load when the pressing reference value set in the reset operation regarding the pencil cleaning member 81 is zero. Since the measurement value of the third load cell 82 when the pressing reference value set in the reset operation is zero is used in the closed loop control, the load applied to the substrate W can be appropriately matched with the target load.

During the closed loop control, the controller 50 moves the pencil cleaning member 81 at a low speed. The speed ratio of the low speed movement with respect to the high speed movement of the pencil cleaning member 81 is, for example, 100/5.

By performing the reset operation, the reference position of the pencil cleaning member 81 is appropriately set to a position that is close to and in non-contact to the substrate W. Therefore, the distance that the pencil cleaning member 81 moves at a high speed can be increased and the distance that the pencil cleaning member 81 moves at a low speed can be decreased, so that the time required for the cleaning process by the second cleaning device 32 can be reduced.

In addition, since the reference position of the pencil cleaning member 81 is set to a position that does not contact the substrate W, the pencil cleaning member 81 when contacting the substrate W moves at a low speed. Therefore, the impact when the pencil cleaning member 81 comes into contact with the substrate W can be kept low.

The controller 50 brings the pencil cleaning member 81 into contact with the center O of the substrate W, makes it swing around the central axis R at a predetermined speed by driving the third moving portion 83 while keeping the upper surface of the rotating substrate W in contact with the target load, and makes it move from the substrate W to a position radially outside, thereby, the entire upper surface of the substrate W is scrubbed.

When the cleaning is completed, the substrate W is taken out from the second rotation mechanism 80 and transferred to the drying device 33 by the third transport robot 35.

Thereby, the cleaning process for the substrate W in the second cleaning device 32 is completed.

According to the present embodiment, before cleaning, the cleaning member 61 (63) is pressed against the reference member (substrate W), and after the measurement value of the load cell 62 (64) reaches a predetermined reset load, the cleaning member 61 (63) is moved in the direction away from the reference member. The reset operation is performed such that when the measurement values of the load cell 62 (64) for each unit movement amount of the cleaning member 61 (63) become equal to each other at least twice consecutively, the position of the cleaning member 61 (63) at that time is set as the reference position of the cleaning member 61 (63) at the time of cleaning, and the measurement value of the load cell 62 (64) at that time is set as the pressing reference value at the time of cleaning.

As described above, the measurement value of the load cell 62 (64) may be different before and after the maintenance with respect to the first cleaning device 31. For example, the measurement value of the load cell 62 (64) in a state where the cleaning member 61 (63) is not in contact with the reference member, that is, the value indicating the load with respect to the reference member may be a value other than zero. Here, even if the cleaning member 61 (63) is moved in a state where the cleaning member 61 (63) is not in contact with the reference member, except for the influence of noise, vibration and the like, since the applied load to the load cell 62 (64) does not change, the measurement value of the load cell 62 (64) is constant. Therefore, in the present embodiment, the cleaning member 61 (63) is pressed against the reference member, and after confirming that the reference member is reliably presses the cleaning member 61 (63) by the measurement value of the load cell 62 (64) reaching a predetermined reset load, the cleaning member 61 (63) is moved in a direction away from the reference member. When the measurement value of the load cell 62 (64) for each unit movement amount of the cleaning member 61 (63) becomes equal to each other at least twice consecutively, a reset operation is performed such that the position of the cleaning member 61 (63) at that time is set as the reference position of the cleaning member 61 (63) that is close to the reference member and is in a non-contact position. In addition, a reset operation is performed to set the measurement value of the load cell 62 (64) at the above-described time as a pressing reference value during cleaning indicating that the load on the reference member is zero.

Therefore, in the first cleaning device 31, the reset operation can be performed without complicated adjustment work, and the like, so that the work of the operator can be simplified and the working time can be reduced. It is also possible to prevent variations or the like in the reference position caused by difference of skill of operators. Moreover, since the pressing reference value at the time of cleaning indicating that the load With regard to the reference member is zero can be set appropriately. The difference between the target load of the cleaning member 61 (63) with respect to the reference member at the time of cleaning and the actual load added from the cleaning member 61 (63) to the reference member can be made extremely small, and the reference member can be appropriately pressed with the target load during cleaning. Therefore, the influence on the reference member due to cleaning can be reduced. In addition, since the reference position of the cleaning member 61 (63) can be set in non-contact with and as close as possible to the reference member, the distance that the cleaning member 61 (63) moves at a high speed can be increased, and the distance that the cleaning member 61 (63) moves at a low speed can be decreased so that the time required for the cleaning process can be reduced.

Since the moving portion 71 (72) includes a motor 71*a* (72*a*) that can be controlled by the controller 50 and a ball screw 71*b* (72*b*) coupled to the output shaft of the motor 71*a* (72*a*), the controller 50 can control the position, moving speed, and the like of the cleaning member 61 (63) with high accuracy. Therefore, the impact when the cleaning member 61 (63) comes into contact with the substrate can be reduced, and the load against the substrate of the cleaning member 61 (63) can be appropriately adjusted to a predetermined target load.

The controller 50 controls the moving portion 71 (72) based on the difference between the measurement value of the load cell 62 (64) and the target load when the pressing reference value is zero. Therefore, a closed loop control system can be configured, and the load against the substrate of the cleaning member 61 (63) can be more appropriately adjusted to a predetermined target load.

The first cleaning device 31 further includes a storage 51 that stores data. The controller 50 stores the reference position and the pressing reference value in the storage 51 and also performs the pressing operation that after the reset operation, the cleaning member 61 (63) is moved toward the reference member from the reference position and presses the cleaning member 61 (63) to the reference member with a test load. And the controller 50 stores in the storage 51 at least one of the followings: the measurement value of the load cell 62 (64) when the pressing operation is completed; the movement amount of the cleaning member 61 (63) from the start to the completion of the pressing operation; the elapsed time from the start to the completion of the pressing operation; and the maximum value among the measurement values of the first load cell 62 (64) from the start to the completion of the pressing operation.

Therefore, when the operator performs the pressing operation after the reset operation, after the pressing operation is completed, in the storage 51 of the controller, at least one of the followings is stored: the measurement value of the load cell 62 (64) when the pressing operation is completed; the movement amount of the cleaning member 61 (63) from the start to the completion of the pressing operation; the elapsed time from the start to the completion of the pressing operation; and the maximum value among the measurement values of the first load cell 62 (64) from the start to the completion of the pressing operation. By confirming these results, the operator can confirm whether the maintenance of the first cleaning device 31 is appropriately performed and the first cleaning device 31 can ensure the performance required for the cleaning process.

The cleaning member 61 (63) is a column-shaped roll cleaning member 61 (63) whose outer peripheral surface can come into contact with the surface of the reference member while rotating around the central axis. Since the reference member includes the substrate W, the reset operation can be performed by using the roll cleaning member 61 (63) and the substrate W.

The roll cleaning members 61 and 63 are respectively provided on both sides of the substrate W, and the controller 50 performs a reset operation regarding one roll cleaning member 61 and a reset operation on the other roll cleaning member 63 at different times respectively. Therefore, it is possible to prevent the reset operations of the two roll cleaning members 61 and 63 from affecting each other and to prevent an inappropriate reference position and pressing reference value from being set.

According to the present embodiment, before cleaning, the cleaning member 81 is pressed against the reference member (substrate W or pedestal portion 85), and after the measurement value of the load cell 82 reaches a predetermined reset load, the cleaning member 81 is moved to be separated from the reference member. When the measurement values of the load cells 82 for each unit movement amount of the cleaning member 81 become equal to each other at least twice in consecutively, the position of the cleaning member 81 at that time is determined. A reset operation is performed to set the reference position of the cleaning member 81 at the time of cleaning and to set the measurement value of the load cell 82 at that time as the pressing reference value at the time of cleaning.

As described above, the measurement value of the load cell 82 may be different before and after maintenance of the cleaning device. For example, the measurement value of the load cell 82 in a state where the cleaning member 81 is not in contact with the reference member, that is, the value indicating the load on the reference member may be a value other than zero. Here, even if the cleaning member 81 is moved in a state where the cleaning member 81 is not in contact with the reference member, the load applied to the load cell 82 does not change unless the influence of noise, vibration or the like is removed. Thus, the measurement value is constant. From the above, in the present embodiment, the cleaning member 81 is pressed against the reference member, and it is confirmed that the measurement value of the load cell 82 reaches the predetermined reset load, so that the cleaning member 81 reliably presses the reference member. After the confirmation, the cleaning member 81 is moved in a direction away from the reference member, and when the measurement values of the load cells 82 for each unit movement amount of the cleaning member 81 are equal to each other at least twice consecutively, the following reset operation is performed: the position of the cleaning member 81 at the time is set as a reference position of the cleaning member 81 that is close to the reference member and is in a non-contact position; and the measurement value of the load cell 82 at the time described above is set as a pressing reference value at the time of cleaning indicating the load with respect to the reference member is zero.

Therefore, in the second cleaning device 32, the reset operation can be performed without complicated adjustment work, and the like, so that the work of the operator can be simplified and the work time can be reduced. It is also possible to prevent variations or the like in the reference position caused by difference of skill of operators. Moreover, since the pressing reference value at the time of cleaning indicating that the load with regard to the reference member is zero can be set appropriately. The difference between the target load of the cleaning member 81 with respect to the reference member at the time of cleaning and the actual load added from the cleaning member 81 to the reference member can be made extremely small, and the reference member can be appropriately pressed with the target load during cleaning. Therefore, the influence on the reference member due to cleaning can be reduced. In addition, since the reference position of the cleaning member 81 can be set as close to the reference member as possible without contact, the distance that the cleaning member 81 moves at a high speed can be increased, and the distance that the cleaning member 81 can move at a low speed can be decreased. Therefore, the time required for the process can be reduced.

Since the third moving portion 83 includes a motor 83a that can be controlled by the controller 50 and a ball screw 83b coupled to the output shaft of the motor 83a, the controller 50 can control the position, the transfer speed, and the like of the cleaning member 81 with high accuracy. Thus, the impact when the cleaning member 81 comes into contact with the reference member can be reduced, and the load of the cleaning member 81 with respect to the reference member can be appropriately adjusted to a predetermined target load.

Since the controller 50 controls the third moving portion 83 based on the difference between the measurement value of the third load cell 82 and the target load when the pressing reference value is set to zero, the closed loop control system can be configured and the load of the cleaning member 81 with respect to the reference member can be more appropriately adjusted to a predetermined target load.

The second cleaning device 32 further includes a storage 51 that stores data. The controller 50 stores the reference position and the pressing reference value in the storage 51 and also performs the pressing operation that after the reset operation, the cleaning member 81 is moved toward the reference member from the reference position and presses the cleaning member 81 to the reference member with a test load. And the controller 50 stores in the storage 51 at least one of the followings: the measurement value of the third load cell 82 when the pressing operation is completed; the movement amount of the cleaning member 81 from the start to the completion of the pressing operation; the elapsed time from the start to the completion of the pressing operation; and the maximum value among the measurement values of the third load cell 82 from the start to the completion of the pressing operation.

Therefore, when the operator performs the pressing operation after the reset operation, after the pressing operation is completed, in the storage 51 of the controller, at least one of the followings is stored: the measurement value of the third load cell 82 when the pressing operation is completed; the movement amount of the cleaning member 81 from the start to the completion of the pressing operation; the elapsed time from the start to the completion of the pressing operation; and the maximum value among the measurement values of the third load cell 82 from the start to the completion of the pressing operation. By confirming these results, the operator can confirm whether the maintenance of the second cleaning device 32 is appropriately performed and the second cleaning device 32 can ensure the performance required for the cleaning process.

The cleaning member 81 is formed of the pencil cleaning member 81 that can contact the surface of the reference member while rotating about an axis extending across the surface of the reference member. The reference member is constituted by the pedestal portion 85 located at a position different from the substrate W or the substrate W. The pedestal portion 85 has a surface disposed at a position equivalent to the surface of the substrate W; therefore, the reset operation can be performed by using the pencil cleaning member 81 and the substrate W or the pedestal portion 85.

According to the substrate processing apparatus 1 according to the present embodiment, the same operation and effect as the cleaning devices 31 and 32 according to the present embodiment can be performed.

Second Embodiment

Next, a substrate processing apparatus according to the second embodiment of the present invention is described with reference to the drawings. Note that in the second embodiment, the same components as those in the first embodiment are denoted by the same reference numerals, and description thereof is omitted.

Figure 9:
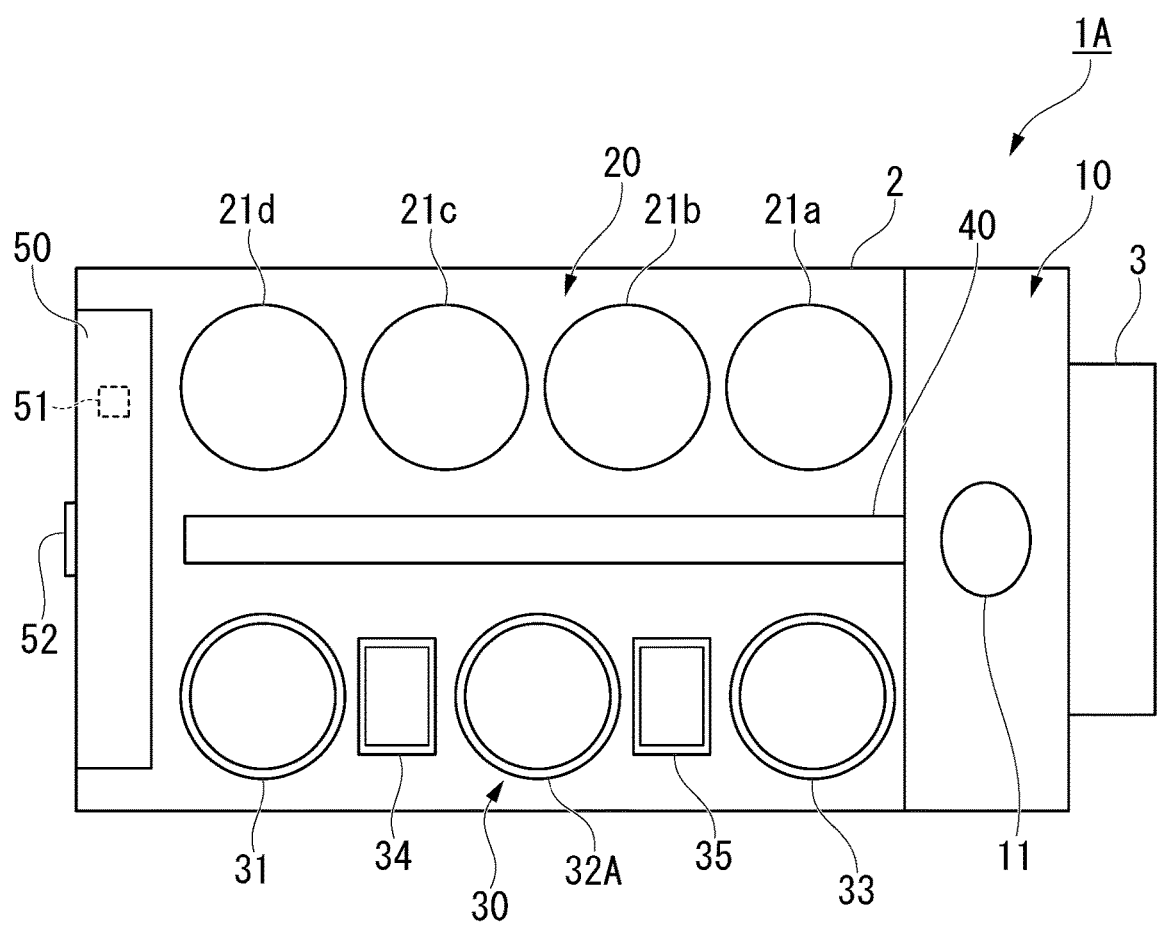
FIG. 9 is a top view showing the whole structure of the substrate processing apparatus of the second embodiment of the present invention.

As shown in FIG. 9, the cleaning portion 30 in the substrate processing apparatus 1A of the present embodiment includes a second cleaning device 32A in place of the second cleaning device 32 of the first embodiment, and the configuration other than the second cleaning device 32A in the substrate processing apparatus 1A is the same as that of the substrate processing apparatus 1 of the first embodiment.

Figure 10:
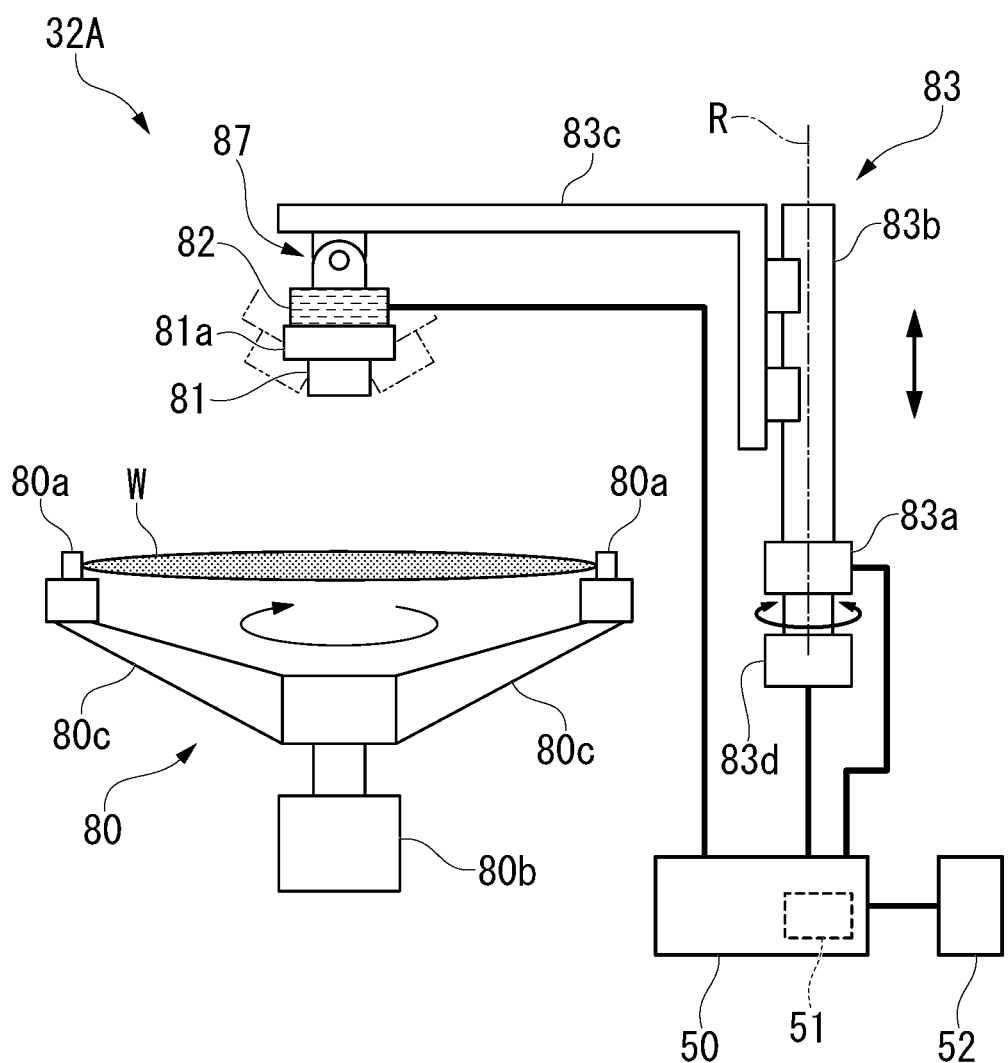
FIG. 10 is a schematic view showing the whole structure of the second cleaning device of the second embodiment of the present invention.

As shown in FIG. 10, the second cleaning device 32A of the present embodiment includes a pencil angle changing portion 87 disposed between the third load cell 82 and the tip portion of the arm 83c of the third moving portion 83.

The pencil angle changing portion 87 includes a first connecting portion 87a integrally connected to the lower surface of the tip portion of the arm 83c, and a second coupling portion 87c integrally connected to the upper surface of the third load cell 82 via a bracket or the like (not shown) and coupled to the first coupling portion 87a via a rotation shaft 87b. The rotating shaft 87b extends in the horizontal direction. The second coupling portion 87c is configured to be rotatable relatively to the first coupling portion 87a around the rotation shaft 87b by a driving portion such as a motor (not shown), and the controller 50 can control the driving portion. Thereby, the pencil angle changing portion 87 is configured to tilt the pencil cleaning member 81 around the rotation shaft 87b. The pencil angle changing portion 87 is configured to tilt the pencil cleaning member 81 in a range where the angle between the central axis of the pencil cleaning member 81 and the straight line extending in the vertical direction is, for example, 0° to 30°.

The pencil angle changing portion 87 has a brake mechanism (not shown), and the pencil cleaning member 81 is held in an inclined state, and in this state, the cleaning operation can be performed by contacting the upper surface of the substrate W. The controller 50 can control the operation of the brake mechanism. Examples of the brake mechanism include a mechanism holding the rotating shaft 87b and the second connecting portion 87c to stop the rotation, a motor with a brake, and the like. By bringing the pencil cleaning member 81 into contact with the upper surface of the substrate W in an inclined state, the contact area between the pencil cleaning member 81 and the upper surface of the substrate W can be made smaller than contacting the pencil cleaning member 81 to the substrate W in an erected state (the central axis of the pencil cleaning member 81 is parallel to the vertical direction). In addition, since the contact area is reduced, the pressure on the contact surfaces of both may be improved, and the pencil cleaning member 81 may easily remove particles on the upper surface of the substrate W.

The pencil angle changing portion 87 of the present embodiment can tilt the pencil cleaning member 81 around one rotation axis 87b. However, another rotation axis orthogonal to the rotation axis 87b may be provided in plan view, and the pencil cleaning member 81 may also be configured to be tilted around the another rotation axis. According to the configuration, the pencil cleaning member 81 can be tilted in any direction orthogonal to the vertical direction. Moreover, the present configuration may be realized by using a ball joint and so on, for example.

In addition, a rotation portion capable of rotating the pencil angle changing portion 87 around an axis extending in the vertical direction may be provided between the pencil angle changing portion 87 of the present embodiment and the arm 83c of the third moving portion 83, and the pencil cleaning member 81 may be tilted in any direction orthogonal to the vertical direction by causing the rotation portion and the rotation shaft 87b to cooperate.

The motor 80b of the second rotation mechanism 80 in the present embodiment is a stepping motor, and the rotation angle and rotation speed of the output shaft thereof are controlled by a pulse signal input from the controller 50. Since the stepping motor operates in synchronization with the pulse signal, the current rotation angle and the like of the output shaft of the motor 80b can be calculated by storing the number of pulses and the like output by the controller 50 to the motor 80b. The motor 80b is not limited to a stepping motor, and for example, a servo motor having an encoder or the like may be used as the motor 80b. Even when a servo motor is used, the controller 50 can calculate the current rotation angle and the like of the output shaft in the motor 80b from the output value of the encoder.

Figure 11:
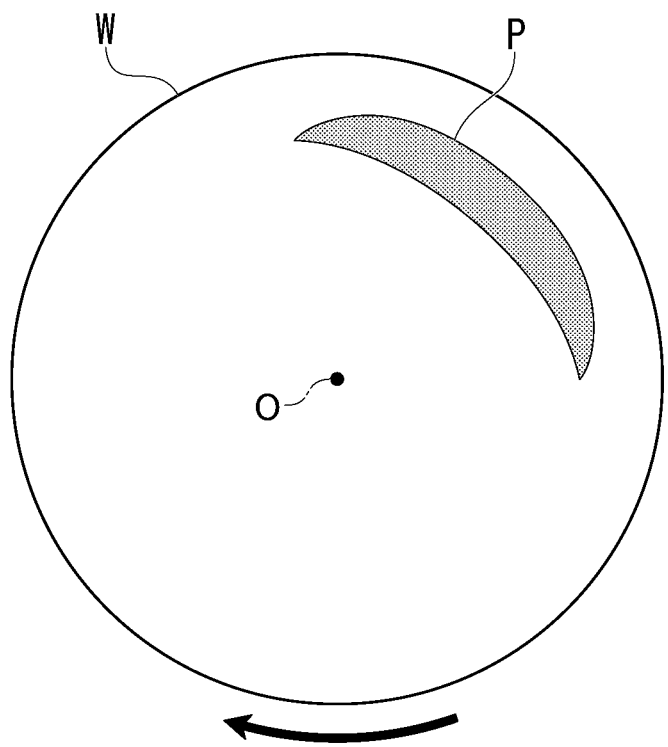
FIG. 11 is a top view showing a distribution of particles on the substrate transferred to the second cleaning device of the second embodiment of the present invention.

As shown in FIG. 11, particles tend to remain in a specific region P for example, on the upper surface of the substrate W that is cleaned by the first cleaning device 31 and transferred to the second cleaning device 32A via the second transport robot 34. On the other hand, a portion other than the region P may be relatively clean. In the example shown in the figures, the region P occurs in a portion in the radial direction of the substrate W and a portion in the circumferential direction of the substrate W, and has a shape extending in the circumferential direction.

The storage 51 of the present embodiment can store data relating to the position of the region P. The data related to the position of the region P is, for example, data related to the radial position and the circumferential position. Note that the data related to the position of the region P may be data related to at least one of the radial position and the circumferential position.

As a method of creating data related to the position of the region P and storing the data in the storage 51, for example, a method is used such that an operator confirms the upper surfaces of the plurality of substrates W cleaned by the first cleaning device 31 and inputs the data via the display 52 or the like, or an imaging device provided in the substrate processing apparatus 1A captures the upper surface of the substrate W after being cleaned by the first cleaning device 31.

Since the substrate W cleaned by the first cleaning device 31 is transferred to the second cleaning device 32A in a certain procedure using the second transfer robot 34 or the like, by referencing the data regarding the position of the region P, the controller 50 can calculate the circumferential position of the region P when the substrate W is held by the second rotation mechanism 80 of the second cleaning device 32A.

As described above, since the controller 50 can calculate the current rotation angle and rotation speed of the output shaft in the motor 80b, with reference to the data of these rotation angle and rotation speed and the data regarding the circumferential position of the region P, the circumferential position of the region P on the substrate W rotating by the operation of the second rotation mechanism 80 can be calculated.

Next, the cleaning operation for the substrate W of the second cleaning device 32A is described. The cleaning operation of the second cleaning device 32A is performed by the controller 50 controlling the second cleaning device 32A. In addition, the controller 50 sequentially executes a program stored in the storage 51, whereby the cleaning operation of the second cleaning device 32A is performed.

The substrate W cleaned by the first cleaning device 31 is transferred to the second cleaning device 32A via the second transport robot 34 and held by the second rotation mechanism 80. At this time, the pencil cleaning member 81 is at the original position thereof.

Subsequently, by the control of the controller 50, pure water or the like is supplied from a nozzle (not shown) to the upper surface of the substrate W, and the rotation speed of the substrate W and the rotation speed of the pencil cleaning member 81 are adjusted to predetermined values, respectively. The rotation speed of the substrate W is slower than the rotation speed of the substrate W during the cleaning operation by the second cleaning device 32 of the first embodiment that is for example, 5 $min^{-1}$. The rotational speed of the pencil cleaning member 81 is the same as that in the first embodiment, and is, for example, 50 $min^{-1}$.

Subsequently, the controller 50 refers to the data regarding the position of the region P stored in the storage 51, and swings the arm 83c of the third moving portion 83 around the central axis R so that the pencil cleaning member 81 is arranged at the same position in the radial direction as the region P in a plan view. At this time, the pencil cleaning member 81 may be disposed at a position shifted from the region P in the circumferential direction in plan view.

Subsequently, the controller 50 tilts the pencil cleaning member 81 around the rotation axis 87b by the operation of the pencil angle changing portion 87 according to the width of the region P in the radial direction, and holds the state. For example, when the width of the region P in the radial direction is small, in order for the pencil cleaning member 81 to be brought into contact with only the region P on the upper surface of the substrate W and is not contacted with other portions, the inclination of the member 81 is increased to reduce the contact area between the pencil cleaning member 81 and the upper surface of the substrate W. On the other hand, when the width in the radial direction of the region P is large, the contact area between the pencil cleaning member 81 and the upper surface of the substrate W is increased by decreasing the inclination of the pencil cleaning member 81 or by erecting the pencil angle changing portion 87.

Subsequently, the controller 50 moves the pencil cleaning member 81 toward the upper surface of the substrate W, calculates the position in the circumferential direction of the region P in the rotating substrate W, and based on the calculated position, brings the pencil cleaning member 81 appropriately into contact with the region P. The region P of the present embodiment extends in the circumferential direction. The pencil cleaning member 81 is brought into contact with the upper surface of the substrate W when one end portion in the circumferential direction of the region P in the rotating substrate W is at the same position as the pencil cleaning member 81 in plan view. The pencil cleaning member 81 is subjected to scrub cleaning from one end portion in the circumferential direction of the region P to the other end portion by relatively moving the pencil cleaning member 81 with the rotation of the substrate W. When the other end portion in the circumferential direction of the region P in the rotating substrate W is at the same position as the pencil cleaning member 81 in plan view, the pencil cleaning member 81 is separated from the upper surface of the substrate W.

Thereby, the pencil cleaning member 81 can scrub clean the region P extending in the circumferential direction on the upper surface of the substrate W, and remove particles remaining in the region P.

In order to ensure that the pencil cleaning member 81 is in contact with the region P, the pencil cleaning member 81 may be moved so as to contact a region wider than the region P in the circumferential direction. For example, the pencil cleaning member 81 is brought into contact with the upper surface of the substrate W before one end portion in the circumferential direction of the region P in the rotating substrate W is at the same position as the pencil cleaning member 81 in plan view. The pencil cleaning member 81 may be separated from the upper surface of the substrate W after the other end portion in the circumferential direction of the region P in the rotating substrate W passes through the pencil cleaning member 81 in a plan view.

When the width in the radial direction of the region P is larger than the width in the radial direction in the contact region between the pencil cleaning member 81 and the upper surface of the substrate W in a state where the pencil cleaning member 81 is erected, it is sometimes may be difficult to clean the entire range of the region P by performing a series of operations of contact, relative movement, and separation with respect to the substrate W only once. In this case, after the pencil cleaning member 81 is separated from the substrate W, the controller 50 may move the pencil cleaning member 81 in the radial direction by swinging the arm 83c, and the above-described series of operations may be repeated again.

In this manner, the region P on the upper surface of the substrate W can be appropriately cleaned by the pencil cleaning member 81, and particles adhering to the region P can be removed.

In addition, in the case where particles adhere only to the region P on the upper surface of the substrate W and other portions are relatively clean, it may be preferable not to bring the pencil cleaning member 81 into contact with the portions other than the region P. The pencil cleaning member 81 of the present embodiment can avoid contact with a portion other than the region P on the upper surface of the substrate W by the control mode of the controller 50 described above; therefore, the influence caused by the contact of the pencil cleaning member 81 other than the region P can be reduced.

In addition, even when the width of the region P in the radial direction is small, the pencil cleaning member 81 of the present embodiment can be tilted by the operation of the pencil angle changing portion 87, it is possible to reduce the contact area of the pencil cleaning member 81 and the upper surface of the substrate W, and thus the contact of the pencil cleaning member 81 with a portion other than the region P on the upper surface of the substrate W can be avoided more reliably. In addition, since the contact area is reduced, the pressure on the contact surfaces of both is improved, and the pencil cleaning member 81 can more easily remove particles on the upper surface of the substrate W.

In the present embodiment, as a method of storing data related to the position of the region P in the storage 51, a method in which an operator confirms the upper surface of the substrate W, or a method in which an imaging device provided in the substrate processing apparatus 1A captures the upper surface of the substrate W are described. However, these methods may be used together.

For example, even if the tendency of the position of the region P can be established to some extent by the operator's confirmation, the generated position of the region P may differ slightly for each substrate W. In such a case, the controller 50 basically controls the movement of the pencil cleaning member 81 based on the data related to the position of the region P stored in the storage 51 by the operator. With regard to a portion of the region P generated randomly, the movement of the pencil cleaning member 81 may be controlled based on data obtained by capturing the upper surface of the substrate W by the imaging device in the substrate processing apparatus 1A. By using such a method together, even if the region P may have an irregular shape, the region P can be cleaned appropriately.

In the present embodiment, when the pencil cleaning member 81 contacts the upper surface of the substrate W and by the rotation of the substrate W, the pencil cleaning member 81 and the substrate W move relative to each other, the inclination of the cleaning member 81 is fixed by the pencil angle changing portion 87. However, the configuration is not limited to such configuration, and the pencil angle changing portion 87 may gradually change the inclination of the pencil cleaning member 81 when the pencil cleaning member 81 and the substrate W are moving relative to each other.

The region P has a shape extending in the circumferential direction; however, the width in the radial direction may increase or decrease from one side to the other side in the radial direction. In such a case, when the pencil cleaning member 81 and the substrate W are moving relative to each other, the pencil angle changing portion 87 gradually changes the inclination of the pencil cleaning member 81 to gradually change the contact area of the pencil cleaning member 81 and the upper surface of the substrate W, thereby the entire range of the region P may be cleaned by performing a series of operations of contact, relative movement, and separation with respect to the substrate W of the pencil cleaning member 81 only once.

In addition, an imaging device provided in the substrate processing apparatus 1A may obtain data regarding the position of the region P by capturing the upper surface of the substrate W rotated by the second rotation mechanism 80 of the second cleaning device 32A, and the controller 50 may be configured to immediately move the pencil cleaning member 81 to an appropriate cleaning position based on the data. In addition, for example, it may be configured to repeat the capturing by the imaging device and the cleaning of the pencil cleaning member 81 until the amount of particles on the upper surface of the substrate W measured by the imaging device is below a predetermined threshold.

The technical scope of the present invention is not limited to the above-described embodiments, and various modifications can be made without departing from the spirit of the present invention.

For example, in the above-described embodiment, the substrate processing apparatus 1 (1A) includes the first cleaning device 31 and the second cleaning device 32 (32A).

However, the present invention is not limited to such a configuration, and each cleaning device may be configured as an independent device.

In the above embodiment, the first cleaning device 31 and the second cleaning device 32 are devices for cleaning the substrate W such as a silicon wafer; however, the devices are not limited to such a configuration, and for example, may be a device for cleaning a glass substrate or the like.

In the above-described embodiment, the central axis of the substrate W held by the first rotation mechanism 60 or the second rotation mechanism 80 is parallel to the vertical direction; however, the present invention is not limited to such a configuration, and the central axis of the substrate W held by the first rotation mechanism 60 or the second rotation mechanism 80 may intersect the vertical direction.

In addition, it is possible to appropriately replace the constituent elements in the above-described embodiments with well-known constituent elements without departing from the spirit of the present invention, and the above-described modified examples may be appropriately combined.

DESCRIPTION OF THE REFERENCE SYMBOLS 1, 1A: substrate processing apparatus, 20: polisher, 30: cleaning portion, 31: first cleaning device (cleaning device), 32, 32A: second cleaning device (cleaning device), 40: substrate transfer portion, 50: controller, 51: storage, 61: first roll cleaning member (roll cleaning member, cleaning member), 62: first load cell (measurement portion), 63: second roll cleaning member (roll cleaning member, cleaning member), 64: second load cell (measurement portion), 71: first moving portion (moving portion), 71a: motor, 71b: ball screw, 72: second moving portion (moving portion), 72a: motor, 72b: ball screw, 81: pencil cleaning member (cleaning member), 82: third load cell (measuring portion), 83: third moving portion (moving portion), 83a: motor, 83b: ball screw, 85: pedestal portion (reference member), W: substrate (reference material)

The invention claimed is:

1. A cleaning device comprising:
an elastically deformable cleaning member;
a moving portion capable of pressing the cleaning member with respect to a surface of a reference member;
a measurement portion measuring a load of the cleaning member with respect to the reference member; and
a controller configured to control the moving portion based on a measurement value of the measuring portion,
wherein the controller configured to perform a reset operation comprising: pressing the cleaning member against the reference member before cleaning by moving the cleaning member toward the substrate,
after the measured value of the measurement portion reaches a predetermined reset load, move the cleaning member in a direction away from the reference member in a plurality of unit movement amounts,
after two consecutive measurement values of the measurement portion for the plurality of unit movement amounts are determined to be equal to each other, set a position of the cleaning member at the time for use as a reference position of the cleaning member at the time of cleaning and set the measurement value of the measurement portion at the time for use as a pressing reference value at the time of cleaning.

2. The cleaning device according to claim 1, wherein the moving portion includes a motor, and a ball screw coupled to an output shaft of the motor.

3. The cleaning device according to claim 1, wherein the controller is configured to control the moving portion based on a difference between the measurement value of the measurement portion and a target load when the pressing reference value is zero.

4. The cleaning device according to claim 3, further comprising a storage storing data, wherein the controller stores the reference position and the pressing reference value in the storage, and
wherein the controller is further configured to performs a pressing operation after performing the reset operation, the pressing operation comprising:
moving the cleaning member toward the reference member from the reference position and pressing the cleaning member to the reference member with a test load, and
storing in the storage at least one of the following: the measurement value of the measurement portion when the pressing operation is completed; the movement amount of the cleaning member from the start to the completion of the pressing operation; the elapsed time from the start to the completion of the pressing operation; or the maximum value among the measurement values of the measurement portion from start to completion of the pressing operation.

5. The cleaning device according to claim 3, wherein the cleaning member is formed of a cylindrical roll cleaning member whose outer peripheral surface can contact the surface of the reference member while rotating around a central axis, and the reference member is formed of a substrate.

6. The cleaning device according to claim 5, wherein
the roll cleaning member is provided on a first side of the substrate and a second roll cleaning member is provided on a second side of the substrate, and
wherein the controller is further configured to perform a first reset operation comprising the reset operation using the first roll cleaning member and a second reset operation comprising the reset operation using the second roll cleaning member at different times respectively.

7. The cleaning device according to claim 1, wherein the cleaning member is formed of a pencil cleaning member that is contactable with the surface of the reference member while rotating around an axis extending across the surface of the reference member, the reference member comprises a substrate or a pedestal portion arranged at a position different from the substrate, and the pedestal portion has a surface disposed at a position equivalent to the surface of the substrate.

8. A substrate processing apparatus comprising:
a substrate transfer portion that transfers a substrate;
a polishing portion that polishes the substrate; and
a cleaning portion that cleans the substrate,
wherein the cleaning portion comprises the cleaning device according to claim 1.

* * * * *